United States Patent
Pingali et al.

(10) Patent No.: US 8,732,712 B2
(45) Date of Patent: May 20, 2014

(54) SYNTHESIS OF CONCURRENT SCHEDULERS FOR MULTICORE ARCHITECTURES

(75) Inventors: Keshav Kumar Pingali, Austin, TX (US); Donald Do Nguyen, Austin, TX (US)

(73) Assignee: Board Of Regents Of the University of Texas System, Austin, TX (US)

(*) Notice: Subject to any disclaimer, the term of this patent is extended or adjusted under 35 U.S.C. 154(b) by 403 days.

(21) Appl. No.: 13/154,080

(22) Filed: Jun. 6, 2011

(65) Prior Publication Data
US 2011/0302584 A1 Dec. 8, 2011

Related U.S. Application Data

(60) Provisional application No. 61/351,558, filed on Jun. 4, 2010.

(51) Int. Cl.
*G06F 9/46* (2006.01)

(52) U.S. Cl.
USPC ........................................ 718/102

(58) Field of Classification Search
None
See application file for complete search history.

(56) References Cited

U.S. PATENT DOCUMENTS

| | | | | |
|---|---|---|---|---|
| 6,934,947 B1* | 8/2005 | Zeidman | | 718/100 |
| 7,945,466 B2* | 5/2011 | Klett et al. | | 705/7.23 |
| 2006/0026052 A1* | 2/2006 | Klett et al. | | 705/8 |
| 2009/0171742 A1* | 7/2009 | Klett et al. | | 705/8 |

OTHER PUBLICATIONS

Becker et al. "Power and Performance Tuning in the Synthesis of Real-Time Scheduling Algorithms for Embedding Applications", Sep. 2004, pp. 169-174.*
Paulin et al. "Scheduling and Binding Algorithms for High-Level Synthesis", 1988, pp. 1-6.*

* cited by examiner

*Primary Examiner* — Van Nguyen
(74) *Attorney, Agent, or Firm* — Ballard Spahr LLP

(57) ABSTRACT

Systems and methods provide a high-level language for generation of a scheduling specification based on a scheduling policy, and synthesis of scheduler based on the scheduling specification. The systems and methods can permit the use of more sophisticated scheduling strategies than those afforded by conventional systems, without requiring the programmer to write explicitly parallel code. In certain embodiments, synthesis of the scheduler includes implementation of at least one rule related to the scheduling specification through definition of one or more workset objects that are concurrent, a workset object of the one or more workset objects having an addition method, a first poll method, and a second poll method. Such poll methods extend the operability of sequential poll methods. The one or more worksets satisfy a condition for correctness that is less stringent than conventional conditions for correctness.

10 Claims, 14 Drawing Sheets

```
1    Workset ws = new Workset (points);
2    foreach (Point p : ws) {
3       Cavity c = new Cavity (p);
4       c. expand ( );
5       c. retriangulate ( );
6       G. update (c);
7       c. dispatchPoints ( );
8    }
```

```
1    Workset ws = new Workset (G. bad Triangles ( ) );
2    foreach (Triangle t : ws) {
3          if (!G. contains (t)) continue ;
4          Cavity c = new Cavity (t);
5          c. expand ( );
6          c. retriangulate ( );
7          G. update (c);
8          ws. addAll (c. bad Triangles ( ));
9    }
```

```
1    Workset ws = new Workset ({u, w(s, n), w(s, n) ≤ Δ) : (s, u) ∈ E})
2    s. dist = 0
3    foreach ((u, d, light) : ws) {
4          if (d < u. dist) {
5                u. dist = d;
6                for (Node v : u. neighbors ( )) {
7                      float w = G edgeData(u, v);
8                      ws.add ((v, d + w, w <= Δ))
9                }
10         }
11   }
```

FIG. 4

```
1    Workset ws = new Workset({s});
2    foreach (Node u: ws) {
3          L1:
4          while (u. excess > 0) {
5                for (Node v : u. neighbors ( )) {
6                      float cap = G. edgeData(u, v);
7                      if (cap > 0 && u. height == v. height + 1) {
8                            pushFlow(u, v, min(cap, u.excess));
9                            if (v != s && v != t)
10                                 ws.add(v);
11                           if (u. excess == 0)
12                                 break L1;
13                    }
14               }
15               relabel(u)
16         }
17         if (*)
18               globalRelabel( )
19   }
```

FIG. 5

| | | | |
|---|---|---|---|
| $P$ | ::= | Global: $D$   Local: $D$ | *Specification* |
| $D$ | ::= | $R_{NF}^*$  $R_F?$ | *Ordering rule* |
| $R_F$ | ::= | FIFO | *Final rule* |
| | | LIFO | |
| | | Random | |
| $R_{NF}$ | ::= | ChunkedFIFO($k$) | *Non-final rule* |
| | | ChunkedLIFO($k$) | |
| | | Ordered($f_D$) | |
| | | OrderedByMetric($f_M$) | |
| $k$ | | | *Integer* |
| $f_D$ | | | $\mathbf{T} \times \mathbf{T} \to \text{bool}$ |
| $f_M$ | | | $\mathbf{T} \to \mathbb{R}$ |

FIG. 6

$$[\text{FIFO}](a,b) = \text{time}(a) < \text{time}(b)$$
$$[\text{LIFO}](a,b) = \text{time}(a) > \text{time}(b)$$
$$[\text{Random}](a,b) = f_U(a) < f_U(b)$$
$$[\text{ChunkedFIFO}(k)](a,b) = \lfloor \text{time}(a)/k \rfloor < \lfloor \text{time}(b)/k \rfloor$$
$$[\text{ChunkedLIFO}(k)](a,b) = \lfloor \text{time}(a)/k \rfloor > \lfloor \text{time}(b)/k \rfloor$$
$$[\text{Ordered}(f_D)](a,b) = f_D(a,b)$$
$$[\text{OrderedByMetric}(f_M)](a,b) = f_M(a) < f_M(b)$$
$$[R_1\ R_2 \ldots](a,b) = \begin{cases} [R_2 \ldots](a,b) & \text{if } a =_{R_1} b \\ [R_1](a,b) & \text{otherwise} \end{cases}$$

FIG. 7

| Algorithm | Order | Specification |
|---|---|---|
| DMR | Bucketed triangle angle (AS2)<br>Local stack (AS1) | Ordered By Metric ($\lambda t.\ minagle\ (t)$) FIFO<br>Global: ChunkedFIFO($k$) Local: LIFO |
| DT | BRIO (AS1)<br>Random | Ordered By Metric ($\lambda p.\ p.round$) ChunkedFIFO($k$)<br>Random |
| PFP | FIFO<br>HL order (AS1) | FIFO<br>OrderedByMetric ($\lambda n. - n.height$) FIFO |
| PTA | LRF<br>Split worklists (BS-F) | FIFO |
| SSSP | Bellman-Ford<br>Delta-stepping (AS1)<br>Dijkstra (AS2) | FIFO<br>OrderedByMetric ($\lambda n.\ \lfloor 2*n.w/\Delta \rfloor + n.light$) ?0 : 1) FIFO<br>Ordered ($\lambda a, b.\ a.w \leq b.w$) |

FIG. 8

```
1    class OrderedByMetricWorkset implements Workset {
2        Workset [ ] buckets;
3        int cursor;
4
5        void add(T t) {
6            int index = floatToInt (f_M(t));
7            buckets[index].add(t);
8            if (index < cursor) cursor = index;
9        }
10
11       T poll ( ) {
12           T retval = null;
13           while (cursor <buckets.length){
14               retval = buckets[cursor].poll ( );
15               if (retval == null)
16                   cursor++;
17               else
18                   break;
19           }
20           return retval;
21       }
22   }
23
24   OrderedByMetricWorkset scheduler;
25   ThreadPool.fork(N); // spawn N threads
26   T item;
27   while ((item = scheduler.poll ( )) != null) {
28       operator.call(item, scheduler);
29   }
30   ThreadPool.join(N);
```

FIG. 9

```
Lambda<T,Integer> indexer = new Lambda<T, Integer >( ) {
        public Integer call (T item) {
                return item.height;
        }
}
Priority. First (OrderedByMetric.class, indexer)
            .then FIFO.class)
```

FIG. 11

```
Priority.first(G₁.class, args).then(…)
            .thenLocally(L₁.class,args).then(…)
```

FIG. 12

| DMR | Triangle mesh of 550,000 triangles of which 261,100 are totally bad |
|---|---|
| DT | 1,733,360 points generated from edge detection of photograph |
| PFP | A flow network of 526,904 vertices arranged in 14 consecutive 194x194 frames with uniformly random capacities |
| PTA | Analysis of the gimp program |
| SSSP | Road network of western USA, weights are distances between locations: 6,262,104 vertices, 15,119,284 edges |

SYNTHESIS OF CONCURRENT SCHEDULERS FOR MULTICORE ARCHITECTURES

CROSS-REFERENCE TO RELATED APPLICATIONS

This patent application is related to and claims priority from U.S. Provisional Patent Application No. 61/351,558, entitled "WORK-SHARING CONSTRUCTS FOR MULTI-CORE PARALLEL PROGRAMS" and filed on Jun. 4, 2010, which is incorporated herein in its entirety.

NOTICE OF FEDERAL FUNDING

This invention was made with government support under grants CCF-0833162, CNS-071996, CCF-0702353, CNS-0724966, and CNS-0739601 awarded by the National Science Foundation. The government has certain rights in the invention.

SUMMARY

The subject disclosure relates to systems and methods that provide a high-level language for generation of a scheduling specification based on a scheduling policy, and synthesis of scheduler based on the scheduling specification. The systems and methods can permit the use of more sophisticated scheduling strategies than those afforded by conventional systems, without requiring the programmer to write explicitly parallel code. In certain embodiments, synthesis of the scheduler includes implementation of at least one rule related to the scheduling specification through definition of one or more workset objects that are concurrent, a workset object of the one or more workset objects having an addition method, a first poll method, and a second poll method. Such poll methods extend the operability of sequential poll methods. The one or more worksets satisfy a condition for correctness that is less stringent than conventional conditions for correctness. Scheduling policies can be implemented in any object-oriented programming language that supports concurrency (e.g., Java, C#). Implementations of a scheduling specification and resulting scheduler can be optimized according to various protocols.

The embodiments described herein can afford various advantages with respect to conventional technologies and related solutions for concurrent programming. For example, the modular and compositional approach to scheduler synthesis described herein can produce efficient schedulers without requiring users to write complex, concurrent code. Such efficiency is revealed, as an illustration, in a performance assessment of various synthesized schedulers against fixed-function schedulers that exploit work-stealing with local last-in first-out (LIFO) worklists, work-stealing with local first-in first-out (FIFO) worklist, and bulk-synchronous worklists. In an aspect of such assessment, it is shown that (1) for the same scheduling policy, fixed-function schedulers and synthesized schedulers have similar performance, and (2) for certain algorithms, algorithm-specific schedulers synthesized in accordance with features of the subject disclosure outperform fixed-function schedulers.

Additional advantages will be set forth in part in the description which follows or may be learned by practice. The advantages can be realized and attained by means of the elements and combinations particularly pointed out in the appended claims. It is to be understood that both the foregoing general description and the following detailed description are exemplary and explanatory only and are not restrictive.

BRIEF DESCRIPTION OF THE DRAWINGS

The accompanying drawings, which are incorporated in and constitute a part of this specification, illustrate exemplary embodiments and together with the description, serve to explain the principles of the methods and systems.

FIG. 4 presents exemplary pseudocode for generic single-source shortest path algorithm in accordance with aspects described herein.

FIG. 5 presents exemplary pseudocode for preflow-push (PFP) algorithm in accordance with aspects described herein.

FIG. 6 illustrates exemplary scheduler specification syntax in accordance with aspects described herein.

FIG. 7 illustrates exemplary rule semantics in accordance with aspects described herein.

FIG. 8 illustrates exemplary application-specific scheduling specifications in accordance with aspects described herein.

FIG. 9 presents an exemplary naïve bucketed scheduler and its utilization in a parallel runtime system.

FIG. 11 presents exemplary syntax of AS1 for PFP in accordance with aspects described herein.

FIG. 12 presents exemplary syntax of a global rule and a local rule in accordance with aspects described herein.

FIG. 13 presents exemplary datasets employed in exemplary applications of various aspects described herein.

DETAILED DESCRIPTION

Figures 1, 2, 3:
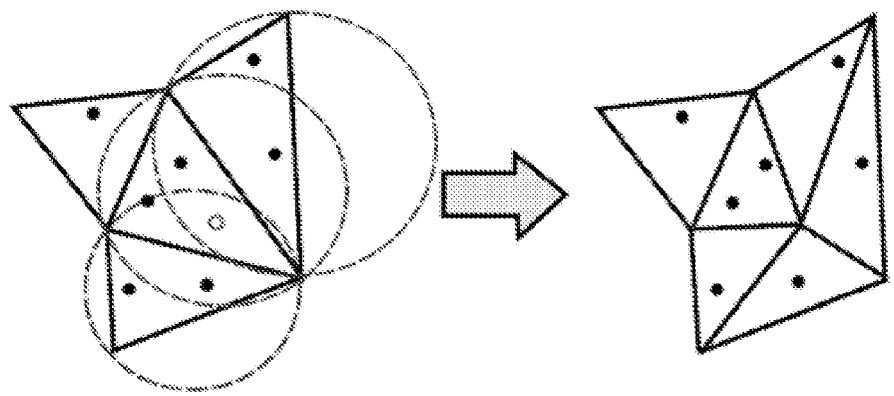
FIG. 1 illustrates exemplary pseudocode for Delaunay triangulation in accordance with aspects described herein.
FIG. 2 illustrates exemplary processing of an active point, represented with an solid-line open circle for Delaunay triangulation in accordance with aspects described herein. Dashed-line circles represent circumcircles of triangles containing the active point.
FIG. 3 illustrates exemplary pseudocode for Delaunay mesh refinement in accordance with aspects described herein.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

As employed in this specification and annexed drawings, the terms "unit," "component," "interface," "system," "platform," and the like are intended to include a computer-related entity or an entity related to an operational apparatus with one or more specific functionalities, wherein the computer-related entity or the entity related to the operational apparatus can be either hardware, a combination of hardware and software, software, or software in execution. One or more of such entities are also referred to as "functional elements." As an example, a unit may be, but is not limited to being, a process running on a processor, a processor, an object, an executable computer program, a thread of execution, a program, a memory (e.g., a hard disc drive), and/or a computer. As another example, a unit can be an apparatus with specific functionality provided by mechanical parts operated by electric or electronic circuitry which is operated by a software or a firmware application executed by a processor, wherein the processor can be internal or external to the apparatus and executes at least a part of the software or firmware application. In addition or in the alternative, a unit can provide specific functionality based on physical structure or specific arrangement of hardware elements. As yet another example, a unit can be an apparatus that provides specific functionality through electronic functional elements without mechanical parts, the electronic functional elements can include a processor therein to execute software or firmware that provides at least in part the functionality of the electronic functional elements. An illustration of such apparatus can be control circuitry, such as a programmable logic controller. The foregoing example and related illustrations are but a few examples and are not intended to be limiting. Moreover, while such illustrations are presented for a unit, the foregoing examples also apply to a component, a system, a platform, and the like. It is noted that in certain embodiments, or in connection with certain aspects or features thereof, the terms "unit," "component," "system," "interface," "platform" can be utilized interchangeably.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

As it can be appreciated, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable computer-executable program instructions (e.g., computer software or computer firmware) embodied in such storage medium. More particularly, yet not exclusively, the methods and systems of the subject disclosure can take the form of web-implemented computer software. Any suitable computer-readable storage medium may be utilized including hard disks, CD-ROMs, optical storage devices, or magnetic storage devices.

Embodiments of methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer-executable instructions (e.g., computer program code instructions). Such computer-executable instructions can be loaded onto a general purpose computer, special purpose computer, or other programmable data processing apparatus or computing device in order to produce a machine, such that the computer-executable instructions which execute on such computers, programmable data processing apparatuses, or computing devices create a means for implementing the functions specified in the flowchart block or blocks.

The computer-executable instructions also can be stored in a computer-readable memory or computer-readable storage medium so that, in response to execution, can direct or cause the computer, the programmable data processing apparatus, or the computing device to function in a particular manner. Computer-executable instructions stored in the computer-readable memory or computer-readable medium produce an article of manufacture including computer-readable computer-executable instructions for implementing the function specified in the flowchart block or blocks or the various block diagrams described herein. In additional or alternative embodiments, the computer-executable instructions can be loaded onto a computer, or other programmable data processing apparatus or computing devices to cause, in response to execution of such instructions, a series of operational actions or acts (referred to, in certain embodiments, as steps) to be performed on the computer or other computing device or programmable apparatus to produce a computer-implemented process such that the instructions that execute on the computer or other programmable apparatus provide actions or acts for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Given a decomposition of a program into activities or tasks, the scheduling problem is the assignment of these activities to processors and the specification of an order in which each processor should execute the activities assigned to it. Scheduling is important for both sequential and parallel implementations of algorithms since it may affect locality and load balance. In certain scenarios, scheduling can affect the total amount of work performed by certain programs.

Scheduling can be accomplished either statically by a compiler or dynamically by a runtime or operating system. Static scheduling can be exploited when dependences between activities are known statically and the execution time of each activity can be estimated accurately at compile-time. For example, stencil computations are the classic illustrations of algorithms amenable to static scheduling. In contrast, dynamic scheduling is useful for problems in which dependences between activities cannot be elucidated statically; new work is created dynamically in a manner that the number of activities is not known statically; or accurate estimates of the time required to execute each activity may not be available. The vast majority of algorithms, including most all irregular algorithms, in which the key data structures are sparse graphs or sparse matrices, require dynamic scheduling.

Conventional solutions to dynamic scheduling have focused primarily on solution of problems in which there are no dependences between activities and new work is not created dynamically. Accordingly, the main scheduling problem is that time required to execute an activity cannot be determined accurately. As an example, self-scheduling of DO-ALL loops in OpenMP is a prototypical example of such conventional solutions. Activities in such scenario correspond to iterations of the DO-ALL loop; the number of iterations is known before the loop is executed, and it is assumed that there are no dependences between iterations. Yet, different iterations may take different and unpredictable amounts of time to execute; thus, to ensure good load balance, OpenMP® provides scheduling policies such as (i) chunked dynamic self-scheduling, in which a processor gets a chunk of k iterations (with k a positive integer) every time the processor needs work, and (ii) guided self-scheduling, in which the chunk size decreases steadily as the loop nears completion. It should be appreciated that chunking reduces the overheads of scheduling and may improve locality.

Other approaches to scheduling concentrate mainly on "task-parallelism," in which new activities are created dynamically although it is still assumed that all activities are independent except for fork-join control dependences. As an example, OpenMP® 3.0 provides support for different dynamic scheduling policies such as breadth-first and work-first policies. Another conventional approach to scheduling is work-stealing, in which each thread maintains a local deque from which the thread initially adds to and removes activities from. When a thread's local deque is empty, the thread selects the local deque of another thread (referred to as the victim thread) and tries to steal activities from such victim thread. Work-stealing can be parameterized by the order maintained in the local deque (e.g., LIFO) and by how a thread selects a victim thread (e.g., random selection). As an illustration, work-stealing has been implemented in MultiLisp and has been adopted by the Cilk language, wherein work-stealing is utilized to implement fork-join parallelism. Various programming environments include work-stealing scheduling.

Key assumptions in conventional solutions reliant on task-parallelism are that any dependences between activities can be captured by fork-join control dependences and are known statically. While these assumptions are reasonable for regular (e.g., dense-array) algorithms and divide-and-conquer algorithms, they do not hold for most irregular graph algorithms because dependences in irregular algorithms generally are complex functions of runtime values (e.g., shape of the graph and values on nodes and edges of the graph), which themselves can change during execution.

An abstract description of parallelism in irregular algorithms can include the following aspects. At each step of the algorithm, there are certain active nodes in the computation graph of the algorithm where computation needs to be performed. Performing a computation at an active node may require reading or writing other graph nodes and edges, known collectively as the neighborhood of that activity—the neighborhood is usually distinct from the neighbors of the active node. In general, there are many active nodes in a computation graph, thus a sequential implementation typically must pick one of them and perform the appropriate computation. In unordered algorithms considered in the subject disclosure, the implementation is allowed to pick any active node for execution. (It should be noted that, in contrast, ordered algorithms typically have a specific order in which active nodes must be executed.) The final output may be different for different orders of executing active nodes, but all such outputs are acceptable, a feature known as don't-care non-determinism. A parallel implementation of such unordered algorithm can process active nodes simultaneously, provided their neighborhoods do not overlap—even though this condition can be relaxed, it is sufficient for correct execution. Yet, the neighborhood of an activity is generally not known until the activity has finished execution. This parallelism is known as amorphous data-parallelism.

In general, efficient exploitation of amorphous data-parallelism requires far more sophisticated runtime support than fork-join parallelism or DO-ALL parallelism for at least the following reasons. (1) In most irregular algorithms, nodes become active dynamically, therefore the number of activities is not known statically. (2) In general, the neighborhood of an activity may be known only after that activity completes execution. Thus, it may be necessary to use optimistic or speculative parallelization. (3) The number of activities that are executed by an algorithm may be dramatically different for different schedules.

For at least the foregoing reasons, even sequential implementations of irregular algorithms often utilize handcrafted, algorithm-specific scheduling policies. For instance, some mesh refinement algorithms process triangles or tetrahedra in decreasing size order because such processing can reduce the total amount of refinement work. Yet, following particular orders strictly can dramatically reduce parallelism and therefore parallel implementations of irregular algorithms commonly use more complex scheduling policies that trade off extra work for increased parallelism. Schedulers associated with such scheduling policies are concurrent data structures and add to the complexity of parallel programming. Moreover, such a scheduler cannot easily be reused for other applications.

Embodiments of the subject disclosure provide a flexible and efficient approach for specifying and synthesizing schedulers for sequential and parallel implementations of irregular algorithms. In an aspect, a scheduling policy, which is a description (possibly informal, for example) of the order in which activities should be processed (e.g., LIFO, FIFO, and so forth), is distinguished from a scheduling specification, which is a formal description of a scheduling policy. In addition, a scheduling specification is distinguished from a scheduler, which is concrete implementation of the scheduling specification. A schedule is a specific mapping of activities to processors in time. In an aspect, a simple compositional specification language is provided, wherein such language can encode a scheduling policy—either conventional or customized—into a scheduling specification. In another aspect, efficient parallel schedulers can be synthesized from scheduling specifications. In yet another aspect, synthesized schedulers are assessed against fixed function schedulers that use work-stealing with local LIFOs, work-stealing with local FIFOs and bulk-synchronous worklists. It should be appreciated that fixed-function schedulers and synthesized schedulers are not mutually exclusive. In particular, yet not exclusively, work-stealing with local LIFOs can be seen as one implementation of a LIFO policy; yet, in the subject disclosure, the two implementations are distinguished in order to more clearly convey various aspects. As an illustration, synthesized schedulers for five irregular algorithms on three multicore architectures are evaluated and reveal that the performance of certain algorithms can improve by orders of magnitude with the right scheduling policy and, for a specific scheduling policy, overheads of schedulers synthesized in accordance with aspects of the subject disclosure are comparable to those of fixed-function schedulers.

Scheduling policies can be implemented in any object-oriented programming language that supports concurrency (e.g., Java, C#). Implementations of a scheduling specification and resulting scheduler can be optimized according to various protocols.

Exemplary Irregular Algorithms

Various algorithms available in the literature exhibit amorphous data-parallelism. As an illustration, five such algorithms are described herein; these algorithms also permit performance assessment of schedulers synthesized in accordance with aspects of the subject disclosure. The algorithms described herein are unordered, (e.g., activities can execute in any order) and each of such algorithms has at least one algorithm-specific (AS) scheduling policy that has been proposed in the literature. In an aspect, pseudocode for these algorithms can be written using the Galois programming model. Galois programming model is a sequential, object-oriented programming model augmented with a Galois unordered-set iterator which is similar to set iterators in C++ or Java, but permits new items to be added to a set while it is being iterated over. Namely, in foreach (e: Set S) {B(e)} the loop body B(e) is executed for each item e of set S. The order in which iterations execute is indeterminate and can be selected by a particular implementation. There may be dependences between the iterations. An iteration may add items to S during execution.

Delaunay Triangulation.—Finding a Delaunay triangulation (DT) of a set of points is a classic computational geometry problem. There are many algorithms for finding the DT. Here, as an illustration, the incremental algorithm of Bowyer and Watson is described. Each point is associated with a triangle that contains it. In the subject description, it is assumed that points are in a two-dimensional (2D) space. Initially, there is one large triangle that covers all the points. Each point p calculates all triangles whose circumcircles include p. This is the cavity of p. The cavity is re-triangulated, p is removed and the remaining points of the cavity are redistributed among their corresponding triangles. FIG. 1 presents exemplary pseudocode for the subject DT algorithm. In an aspect, G is the graph representing the triangulation. FIG. 2 illustrates exemplary processing of an active point, represented with a solid-line open circle for Delaunay triangulation in accordance with aspects described herein. Dashed-line circles represent circumcircles of triangles containing the active point.

All orders of processing points lead to the same Delaunay triangulation. Certain conventional solutions have shown that selecting points at random is optimal. Alternative solutions have put forward an algorithm called biased randomized insertion order (BRIO) that takes advantage of locality while still maintaining the optimality of randomness. Briefly, let n (a positive integer) be a number of points to triangulate. Points are processed in log(n) rounds. The probability that a point is processed in the final round is ½. For the remaining points, the probability that they can be processed in the next-to-last round is ½ and so forth until the first round. For the first round, all remaining points are processed with probability 1. Within a round, points are processed according to the spatial divisions of an oct-tree.

Delaunay Mesh Refinement.—Delaunay mesh refinement (DMR) is an algorithm related to Delaunay triangulation. For a specific Delaunay triangulation, in certain scenarios, triangles may have to satisfy additional quality constraints beyond that guaranteed by triangulation. To improve the quality of a triangulation, DMR iteratively fixes "bad" triangles, which do not satisfy the quality constraints, by adding new points to the mesh and re-triangulating. It should be appreciated that refining a bad triangle may itself introduce new bad triangles, but it can be shown that, at least in 2D, this iterative refinement process will terminate and produce a guaranteed-quality mesh.

FIG. 3 illustrates exemplary pseudocode for DMR in accordance with aspects described herein. Delaunay mesh refinement is similar to Delaunay triangulation, except that activities are centered on triangles rather than points. For DT and DMR, a cavity is expanded and re-triangulated. However, in DMR, new bad triangles can be created and thus require further processing. Bad triangles can be tracked in a workset. It is noted that in this specification and accompanying drawings, the term workset is employed to refer to a formal entity (e.g., data structure) that behaves as a bag or a multiset and can comprise duplicate items. Additionally, different orders of processing bad triangles can lead to different meshes, but all such meshes satisfy the quality constraints and are acceptable outcomes of the refinement process. In contrast, for Delaunay triangulation, different orders still produce the same triangulation.

Naive implementations of DMR generally have quadratic worst-case running times although they perform well in practice. Miller proved sub-quadratic worst-case time of a modification of DMR that processes triangles in decreasing circumcircle diameter together with other changes. In certain conventional solutions (e.g., the computer program "Triangle: A Two-dimensional Quality Mesh Generator and Delaunay Triangulator" authored by J. R. Shewchuck) bad triangles are placed into buckets according to their minimum angle, each bucket stores triangles in FIFO order, and buckets are processed in increasing-angle order. Alternative conventional solutions to the DMR have showed that a parallel implementation of DMR that distributes the initial bad triangles among threads and uses thread-local stacks for newly created bad triangles performs well in practice.

Inclusion-based Points-to Analysis.—Inclusion-based points-to analysis (PTA), also known as Andersen's algorithm, is a flow and context-insensitive static analysis that determines the points-to relation for program variables. PTA is a fixpoint algorithm that computes the least solution to a system of set constraints. In one aspect, the PTA algorithm maintains a workset of program variables whose points-to relations need to be computed. For each variable in the workset, the algorithm examines the system of constraints to determine if the current variable satisfies the constraints. In case of an affirmative determination, the algorithm continues processing the remaining variables. In the alternative, some set of program variables are modified to satisfy the constraints. These modified variables are then added to the workset, and the algorithm continues until the workset is empty. Certain conventional solutions have showed how the basic fixpoint algorithm augmented with sophisticated cycle-detection can scale to large problem sizes. In addition, such solutions have served to produce parallelized implementation of PTA.

It should be appreciated that since PTA is a fixpoint algorithm, any order of processing variables can produce the same solution. Many heuristics have been proposed for organizing the workset, such as processing variables in least recently fired (LRF) order or dividing the workset into current and next parts. Variables are processed from the current part, but newly active variables are enqueued onto the next part. When the current part is empty, the roles of the current and next parts are swapped. It has been reported the divided workset approach performs better in practice.

Single-source Shortest-path.—Given a weighted, directed graph G=(V, E), a weight function w: E→$\Re$ mapping edges to real-valued weights, and a source node s ∈ V, the single-source shortest-path (SSSP) problem is to find the least weight path from s to all other nodes in the graph. Here, $\Re$ denotes the real numbers domain. The Bellman-Ford algorithm can solve this problem on graphs with arbitrary weights. In the case of graphs with no negative weight edges, specialized algorithms, such as Dijkstra's algorithm, are available. In the subject disclosure, the case where graphs have no negative weight edges is considered. The Bellman-Ford algorithm also can be optimized for such case by reformulating it as a fixpoint algorithm. Instead of processing each node |V| times, there is a workset that maintains nodes whose distances have changed; only those nodes are processed. One conventional parallel SSSP algorithm is delta-stepping.

Each one of these algorithms can be viewed as an instantiation of a generic algorithm with different scheduling policies 1; see, e.g., FIG. 4. Each node n has a tentative distance estimate n.dist (initialized to ∞), and there is a set ws of distance requests (u, d, light) indicating that node u can be updated with distance d. The additional light value is only used by the delta-stepping algorithm. If the requested distance d is less than the current distance u.dist at node u, then the current distance is updated. This generates a set of new requests based on the new value of u.dist that are then added to ws.

The Bellman-Ford algorithm, when optimized, can process requests in arbitrary order. In turn, Dijkstra's algorithm is an ordered algorithm which processes requests in increasing distance order. Moreover, the delta-stepping algorithm orders requests as follows. The algorithm creates a sequence of buckets, $b_1, b_2, \ldots, b_N$. Bucket $b_i$ contains all requests with distances in the range [$\Delta(i-1)$, $\Delta i$) where $\Delta$ is an input to the algorithm. Furthermore, requests are divided into light requests, whose distances come from edges with weight less than $\Delta$, and heavy requests otherwise. Requests are processed in increasing bucket order. Within a bucket, light requests are processed before heavy ones.

Preflow-push.—For a directed graph G=(V, E), a capacity function c: E→$\Re^+$ mapping edges to non-negative values and source and sink nodes s, t ∈ V, the preflow-push algorithm computes the maximal flow from source to sink. Here, $\Re^+$ denotes the positive-real numbers. Unlike in max-flow algorithms based on augmenting paths, nodes in preflow-push (PFP) can temporarily have more incoming flow than outgoing flow. Each node n maintains its excess inflow n.excess. Each node n also has a label called height, which is an estimate of the distance from n to t in the residual graph induced by unsaturated edges. Nodes with non-zero excess that are not the source or sink are contained in a workset. Such nodes are called active nodes. The PFP algorithm repeatedly selects a node from the workset. Each node attempts to eliminate its excess by pushing flow to a neighbor; see, e.g., FIG. 5. Pushing flow can cause a neighbor to become active. In one aspect of the PFP algorithm, a node only can push flow to a neighbor at a lower height. If a node is active but no neighbors are eligible to receive flow, the node relabels itself, increasing its height to one more than its lowest height neighbor.

Certain conventional solutions have shown the importance of two heuristics named (a) global relabeling and (b) gap relabeling. Global relabeling is a technique that periodically reassigns heights by performing a breadth-first traversal from the sink. The frequency of global relabeling is determined empirically. Gap relabeling is a technique that preemptively removes from the workset any nodes that cannot push flow to the sink. The key insight is that if no node has height h, all nodes with height greater than h cannot push flow to the sink. In addition, such conventional solutions contemplate two orders for processing active nodes: HL (high-low) order, where nodes are processed in decreasing height order, and FIFO order. A parallel implementation of PFP in accordance with aspects of the subject disclosure includes all these heuristics. Performance of such implementation is described herein.

Scheduling Policies

As presented herein, several irregular algorithms can benefit from scheduling strategies that are more complex than simple strategies like LIFO and FIFO. The informal policies described in the previous section can be encoded in high-level specification language in accordance with aspects of the subject disclosure.

Scheduling specifications are built from ordering rules, where an ordering rule specifies a total order on activities or items. For two specific items a and b, an ordering rule R may specify that a should be processed before b (written as $a<_R b$) or vice versa ($b>_R a$), or it may leave the order unspecified ($a=_R b$). For example, if items have integer priorities, an ordering rule $A_1$ may order them in ascending priority order; the relative order of items with the same priority is left unspecified by $A_1$. Ordering rules can be composed sequentially in a manner similar to lexicographic ordering: a sequence $D=R_1 R_2 R_3 \ldots$ is itself an ordering rule that first orders items according to $R_1$; if two items are not strictly ordered by $R_1$, they are ordered according to $R_2$, etc. For another example, if $F_1$ orders items in FIFO order, then $A_1 F_1$ denotes the order in which items are processed in increasing priority order and items with the same priority are processed in FIFO order. In an aspect, for the scheduler synthesis aspects disclosed herein, it generally is convenient to distinguish between final rules, which are rules that appear last in an ordering sequence, and non final rules.

As discussed herein, certain implementations of irregular algorithms can maintain separate global and thread-local worksets, so it is natural to use different ordering rules for them. A scheduling specification can have both a global ordering rule and a local ordering rule. The global rule can be applied to the initial set of items, and the local rule can be applied to each thread-local workset, which holds items created dynamically by the corresponding thread. A thread accesses the global workset only when its local workset is empty. Continuing the previous example, if $L_1$ is last-in-firstout (LIFO) order, then global order $A_1F_1$ and local order $L_1$ specify that global items are processed as before, and local items are processed in LIFO order.

FIG. 6 presents exemplary syntax rules for scheduler specifications. In FIG. 6, T represents the type of items. FIG. 7 presents rule semantics in accordance with aspects of the subject disclosure. In one aspect, the meaning of an ordering rule R is given as a function over items a and b that is true iff $a <_R b$ (here, < is the standard order on integers and reals). For the FIFO and LIFO rules, an auxiliary function time is defined which maps an item to an integer according to when the item is added to a scheduler. For the first item $x_1$ added to the scheduler, time($x_1$)=0; for the second item $x_2$, time($x_2$)=1, and so forth. In one aspect, $f_U$ is an injective function mapping items to integers. This function essentially encodes a random permutation of items. The function $f_D$ should be consistent with a total order.

FIG. 8 illustrates exemplary application-specific scheduling specifications in accordance with aspects described herein and in connection with exemplary irregular algorithms. In diagram 800, an irregular algorithm (labeled "Algorithm") has an associated desired scheduling policy, which represents a desired algorithmic order (labeled "Order"). In one aspect, such scheduling policy can be cast into a scheduling specification (labeled "Specification") by representing the desired algorithmic order through scheduler specification syntax (see, e.g., FIG. 6) indicative of the ordering rules pertinent to the desired algorithmic order. When a scheduling specification has an empty local ordering, the global tags and local tags can be omitted. The BRIO specification assumes that items have already been assigned rounds according to the random distribution described previously. To process light requests before heavy ones, the delta-stepping specification splits each bucket into two: one part for the light requests and one part for the heavy requests.

Scheduler Synthesis

Implementation of sequential schedulers from policies specified in the high-level language of the subject disclosure can be readily accomplished. Each rule in a scheduling specification of a sequential process can be implemented by a workset, which is an object with the following methods:

void add(T t)—which adds an item to the workset; and

T poll ( )—which removes and returns the next item to execute; if there are no items left, returns a null value distinct from all items added to the workset.

Items are added to the workset by invoking the add method, which returns the value void when it completes. To get items from the workset, the poll method is invoked; if this method invocation does not find any items in the workset, it returns a unique null value.

In one approach, synthesis of concurrent worksets can implement such functionality in a concurrent execution environment by composing a non-empty set of library components, each component of the library components being a workset by itself. In another aspect of such approach, there can be a workset for each final rule. In yet another aspect of such approach, a non-final rule can be implemented by a workset parameterized by a function that constructs instances of the next workset in the ordering sequence—such workset is referred to as the inner workset.

However, as discussed hereinafter, a naive implementation along these aspects of such approach can be incorrect in a concurrent setting and a resulting concurrent workset may not satisfy any intuitive notion of correctness such as linearizability. To at least address such shortcoming, a relaxed correctness condition is introduced, wherein the relaxed correctness condition requires modifications to the semantics of worksets and to how the worksets are utilized by clients (e.g., a thread). In an aspect, introduction of the relaxed condition has at least two implications: (1) a final scheduling policy rule has an implementation that satisfies the relaxed condition, and (2) a non-final workset satisfies the relaxed condition assuming only that their inner workset(s) satisfy the relaxed condition. Such implications permit compositional construction of worksets as described herein.

Synthesis of concurrent schedulers as described herein is based on scheduling specifications (see, e.g., FIG. 8) defined in accordance with a high-level scheduler specification language (see, e.g., FIG. 6). For unordered algorithms, such scheduling specifications are inherently "fuzzy"—even FIFO scheduling of a workset can result in different executions depending on the speed of processors. Therefore, scheduling specifications serve as a guideline for, or advice to, the runtime system regarding a manner of biasing scheduling decisions for efficiency. In conventional program synthesis, in contrast, implementations typically are devised to satisfy specifications exactly. In addition, certain conventional solutions for parallelizing irregular algorithm applications in which dependences can be computed at runtime after the input data (e.g., data in FIG. 13) has been supplied to, the program differ from concurrent scheduler synthesis described herein in that such conventional solutions do not contemplate scheduling strategies for controlling the amount of work performed by the implementation, for enhancing locality, and the like.

Exemplary Issues with Naive Composition.—To understand certain issues that can arise in composing worksets, an exemplary implementation of the OrderedByMetric rule in lines 1-23 of FIG. 9, and its client, a simple runtime system, in lines 24-30 of FIG. 9 are considered. The runtime system can manage threads and can assign work to one or more threads. The workset creates an array of inner worksets and processes each inner workset in ascending order. Such workset is essentially an implementation of a priority queue in which the range of keys is known a priori; there is one inner workset (e.g., a bucket) for each key value. Similar, yet not identical, worksets have been exploited in a variety of sequential and parallel implementations of irregular algorithms.

It should be appreciated that the workset depicted in FIG. 9 can exhibit incorrect behavior because it is possible for items to be inserted into the workset but never retrieved. Consider two threads $T_1$ and $T_2$, where $T_1$ is executing the poll method and $T_2$ is executing the add method. In an exemplary scenario, the following sequence of events may take place: (1) $T_1$ executes line 14. The cursor value is i and the the poll method on buckets[i] returns null. Here parameter i is a positive integer. (2) $T_2$ executes lines 6-8. The value of index=i, therefore an item is added to buckets[i]. (3) $T_1$ executes lines 15 and 16 of the poll method, incrementing cursor. It is apparent that the item added by $T_2$ is now lost after event (1) through (3). The race exists even if each line of the implementation is atomic, so that reading and updating the cursor on line 8 or incrementing its value on line 16 is performed atomically.

To implement the foregoing sequence of events correctly in a concurrent context, it should be ensured that when poll moves to the next bucket, no thread is adding an element to a higher priority bucket. One solution is to use transactional memory, but the overhead of software transactional memory systems is high, especially for a performance-critical component like a scheduler. While hardware transactional memory systems exist, such systems are not currently readily available.

Such findings can be summarized as follows. In general, simple compositions of worksets do not produce correct concurrent worksets. Composition of concurrent worksets is problematic even in absence of having to maintain a particular order of items.

Relaxed Concurrent Semantics.—In one aspect, workset composition can be implemented in a manner that takes advantage of the fact that scheduling specifications for unordered algorithms are inherently "fuzzy" and are intended as suggestions to the runtime system rather than as commands to be followed exactly. Broadly described, to accomplish such composition the following is adopted. (a) The behavior of poll is relaxed to ensure that in a parallel setting, poll can return an item that is different than the item the poll method would have returned in a sequential setting. In addition, poll is defined (e.g., it comprises a definition) to return null even when items remain in the workset. These modifications permit us to implement poll with low overhead. (b) To compensate for the relaxed behavior of poll, an additional method poll-s is introduced, wherein poll-s that is similar to poll, but it is never executed concurrently with other invocations (e.g., a method invocation). The method poll-s returns null only when a workset is truly empty. In an aspect, it should be appreciated that if most items are retrieved from the workset utilizing poll, and poll-s is utilized infrequently to determine if the workset is truly empty, a solution for a scheduler can be achieved that is both correct and efficient. In one aspect, the behavior of poll and poll-s is closed under composition.

In one aspect, a workset is modeled by its history H, which is a finite sequence of events, where an event is one of a method invocation, a response to a method invocation, or a special termination event ⟨term⟩. Regarding nomenclature, ⟨o.m(a,b, . . . ) T⟩ represents an invocation on object o of method m with arguments a, b, . . . by thread T; ⟨o.m (a,b, . . . )/r T⟩ represents a response to method m with return value r; and void for the unit return value. An invocation ⟨$o_1.m_1(a_1, b_1, \ldots )$ $T_1$⟩ matches a response ⟨$o_2.m_2(a_2, b_2, \ldots )$/r $T_2$⟩ if $o_1=o_2$, $m_1=m_2$, $a_1=a_2$, $b_1=b_2$ and so forth, and $T_1=T_2$. One or more of the object or thread are omitted when apparent from context. Variables $x_1, x_2, \ldots$ are utilized as variables over arguments or return values.

An invocation is said to be pending in H if the invocation lacks a matching response. A history is said to be whole if the history has no pending invocations and it contains exactly one termination event and the termination event is the last event in the history. A history restricted to object o or thread T is the subsequence with only events on o or by T respectively and possibly a termination event. Without loss of generality, it is assumed that items are unique. The notation $a \rightarrow_H b$ denotes that event a precedes event b in history H; such notation is replaced by $a \rightarrow b$ when the history is clear from context.

In one aspect, a formal property of a history H is presented below and it is referred to as "Property 1." Such property is a formal description of the behavior of poll and poll-s described herein.

Property 1 (Weak Bag). A history H models a weak bag if the following are true:

B1. There is an infective function M from non-null response events $e_1=$⟨poll( )/$x_1$ $T_1$⟩ or $e_1=$⟨poll-s( )/$x_1$ $T_1$⟩ to invocation events $e_2=$⟨add($x_2$) $T_2$⟩ such that (1) M ($e_1$)=$e_2$, (2) $x_1=x_2$, and (3) $e_2 \rightarrow e_1$.

B2. For each invocation event e=⟨poll-s( ) T⟩ of poll-s in H=$H_1$, e,$H_2$, there are no pending invocations in $H_1$.

B3. For each null response event e=⟨poll-s( )/null T⟩ of poll-s in H=$H_1$, e,$H_2$, $H_1$ satisfies condition B1 and M is a bijective function.

Condition B1 states that (1) items returned by poll and poll-s must have been added earlier by the add method, and (2) a given item can only be returned once. Both requirements are captured by the injective function M. Condition B2 states that poll-s cannot be invoked when there are pending method invocations. Condition B3 states that if poll-s returns null, all previously added items have been retrieved by poll or poll-s, and the workset is truly empty. This is captured by requiring M to be a bijective function.

In one aspect, a workset is correct if it only generates whole histories satisfying Property 1. It is the responsibility of the client to use the workset properly by avoiding invocation of poll-s concurrently with other method(s). Such form of correctness can appear to be particularly weak since it does not refer to the sequential ordering semantics. Yet, it has been found to be useful because this form of correctness includes several natural compositions of worksets as well as most hand-written schedulers. A linearizable bag is a correct workset if poll-s is considered to be the same as poll. Likewise, a bag with a single lock guarding all of its methods also is a correct workset. It should be appreciated that it is possible to introduce deadlock when arbitrarily composing worksets with locks. However, compositions based on Theorem 2 described herein and whose implementations are themselves wait-free do not introduce deadlocks.

One correct workset and its proper usage by a runtime system is the following modification of FIG. 9. After line 30, the runtime system should call poll-s; if the returned value is a non-null item, the runtime system should process that item and go to line 25 to continue execution. The poll-s method should walk the bucket array calling poll-s on each inner workset and return the first non-null item if such element exists.

In one aspect, implementations in the Galois system of the final rules ($R_F$) in FIG. 6 satisfy Property 1 since the LIFO and FIFO rules are implemented by a linearizable stack and queue respectively, and the Random rule is implemented with a resizable array and all method invocations are protected by a single lock.

Workset Composition.—It can be demonstrated that implementations of the non-final rules in FIG. 6 satisfy Property 1, assuming that such rules are parameterized by correct worksets. As an illustration, a detailed description for the OrderedByMetric workset is provided. The reasoning for demonstrating the correctness of the other non-final worksets is outlined.

In one aspect, Theorem 1 described herein formalizes the behavior of the OrderedByMetric workset by the history of such workset with respect to its inner worksets. In another aspect, Theorem 2 shows how objects that generate such histories are correct worksets.

Theorem 1 (OrderedByMetric). Let o be an instance of the OrderedByMetric workset in FIG. 9 modified so that each thread maintains a thread-local cursor variable and poll-s walks all the buckets calling poll-s on each inner workset. Let W={$w_1, w_2, \ldots, w_n$} be the set of correct worksets contained in the buckets. The workset o only generates whole histories containing the following non-overlapping sequences when restricted to thread T for all threads:

D1. ⟨o.add(x)⟩,
   ⟨w.add(x)⟩, ⟨w.add(x)/void⟩,
   ⟨o.add(x)/void⟩.

D2. ⟨o.poll( )⟩,
   (⟨w*.add(x)⟩, ⟨w*.poll( )/null⟩)*,
   ⟨w.poll( )⟩, ⟨w.poll( )/x⟩,
   ⟨o.poll( )/x⟩ where x≠null.

D3. The above with poll( ) replaced with poll-s( )

D4. ⟨o.poll( )⟩,
   (⟨w*.add(x)⟩, ⟨m*.poll( )/null⟩)*,
   ⟨o.poll( )/null⟩.

D5. ⟨o.poll-s( )⟩,
   ⟨$w_1$.poll-s( )⟩, ⟨$w_1$.poll-s( )/null⟩, . . . ,
   ⟨$w_n$.poll-s( )⟩, ⟨$w_n$.poll-s( )/null⟩,
   ⟨o.poll-s( )/null⟩.

Here, the symbol "*" represents zero or more repetitions of an event. Proof of Theorem 1. Note that only objects shared between threads executing methods of o are the inner worksets in W, which are represented in FIG. 9 as the variable buckets. Thus, it is sufficient to consider sequential executions of o. The add method readily satisfies clause D1.

In turn, the poll method can either return null or non-null value. In the case of null, each inner workset visited returns null, and o satisfies clause D4. In the case of a non-null value, there are certain number of inner worksets that return null and exactly one that returns a non-null value. Therefore, clause D2 is satisfied. The poll-s method is the same as the poll method except that it visits all the inner worksets in W. By reasoning similar to the poll method, the poll-s method satisfies clauses D3 and D5.

Theorem 2 (OrderedByMetric is correct). Whole histories H satisfying Theorem 1 model a weak bag.

Proof of Theorem 2. Each condition of Property 1 is considered in turn.

First, H satisfies condition B1. Without loss of generality, events of poll are discussed; events of poll-s behave similarly. From clauses D2 and D4, the only time the workset o produces a non-null response $e_1 = ⟨o.poll( )/x_1⟩$ is when one of its correct worksets w ∈ W produces a response $f_1 = ⟨w.poll( )/x_1⟩$. There is exactly one event $e_1$ for each event $f_1$ and vice versa. Let $M_1$ be the bijective function from events of the form $e_1$ to events of the form $f_1$. From clause D1, there is exactly one event $f_2 = ⟨w.add(x_2)⟩$ for each event $e_2 = ⟨o.add(x_2)⟩$ and vice versa. Let $M_2$ be the bijective function from events of the form $f_2$ to events of the form $e_2$.

Figure 10:
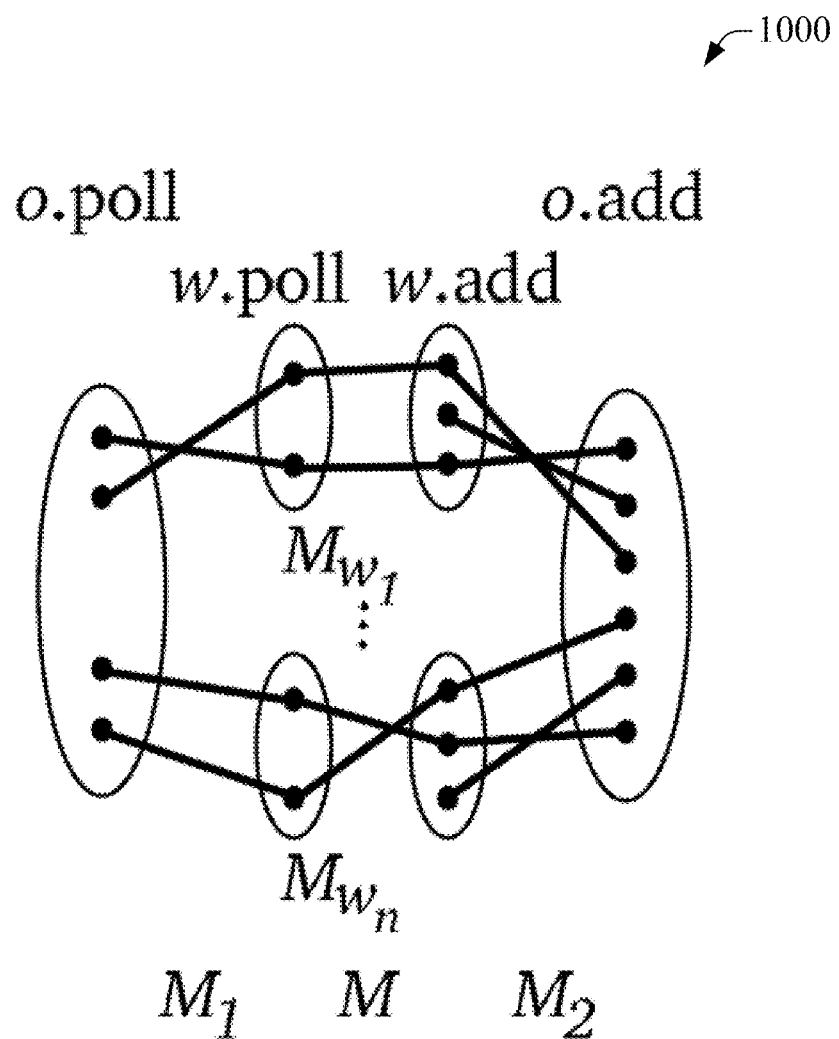
FIG. 10 illustrates an exemplary relationship between a group of bijective functions in the proof of a theorem (e.g., Theorem 2) disclosed herein.

It is now shown that there exists an injective function $M_C$ such that $M_C(e_1) = e_2$, $x_1 = x_2$ and $e_1 \to e_2$. By definition, $M_1(e_1) = f_1 = ⟨w.poll( )/x_1⟩$. Since w is a correct workset, there exists an injective function $M_w$ such that $M_w(f_1) = f_2 = ⟨w.add(x_1)⟩$ and $f_2 \to f_1$. Let M be the expansion of $M_w$ over the range of all w ∈ W. The ranges of $Mw_1, \ldots, M_{wn}$ are disjoint and each $M_w$ is an injective function so M is also an injective function; see, e.g., FIG. 10. By definition, $M_2(f_2) = e_2 = ⟨o.add(x_1)⟩$. Let $M_C$ be the composed function $M_2 \circ M \circ M_1$. $M_C$ is injective because M is injective and $M_1$ and $M_2$ are bijective. $M_C(e_1) = e_2$ by function composition. From clauses D1 and D2, $e_2 \to f_2$ and $f_1 \to e_1$, and by the correctness of w, $f_2 \to f_1$; thus, by transitivity, $e_2 \to e_1$.

Second, H satisfies condition B2. Clients of o do not invoke o.poll-s( ) concurrently. From clauses D3 and D5, it is clear that if there are no pending invocations immediately before o.poll-s( ) is invoked, then there will be no pending invocations immediately before w.poll-s( ) for all w ∈ W.

Finally, H satisfies condition B3. In view of the foregoing, it is known that $M_C$ satisfies condition B1 and is an injective function from non-null poll and poll-s responses to add invocations on o. It is now shown that when o produces the null response {o.poll-s( )/null}, $M_C$ is a bijection as well. From clause D5, if o produces a null response, all w ∈ W have produced a null response as well. Thus, M is a bijection, and correspondingly, $M_C$ is one as well. □.

The ChunkedFIFO rule is implemented with a single linearizable (e.g., global) queue whose elements (e.g., chunks) are instances of the inner workset. Each inner workset contains at most k items. Each thread maintains a thread-local chunk to poll from. When the chunk is empty, the thread polls from the global queue for the next chunk. Each thread also maintains a thread-local chunk to add to. When the chunk is full, the thread adds it to the global queue and creates a new empty chunk to add to. The poll-s method walks each thread-local chunk and the global queue calling poll-s on each.

Theorem 2 does not immediately apply because chunks are created and discarded dynamically. One modification that can be effected is to keep track of all the chunks ever created. However, one observation is that chunks are accessed by at most one thread at a time, and they are discarded when they are empty, which can be determined by invoking poll-s on the chunk. Empty chunks cannot contain any more items. Thus, discarded chunks do not affect the eventual correctness of the workset. Only chunks that may contain items matter, which are those traversed by poll-s.

The ChunkedLIFO rule is implemented similarly to ChunkedFIFO except with a linearizable stack.

The Ordered rule is implemented with a concurrent heap with additional locks to protect the inner worksets. A single global mutex can protect all the methods. In addition, more fine-grained locking can be produced through commutativity conditions to reduce the granularity of the locking. In such case, it is sufficient to used a read-write lock. All methods acquire the lock in read mode. The lock is acquired in write mode only when an operation would make an inner workset empty.

Although not a rule per se, the composition of a global and local rule, used to implement global and local orders in specifications, also is implemented with worksets. There is one workset that implements the global rule and thread-local worksets that implement the local rule. Initial work is added to the global workset, while newly created work is added to the thread-local workset. New work is retrieved from the thread-local workset, if possible, and from the global workset otherwise. For proving correctness, this implementation can be viewed as a refinement of a chunked workset where chunks are never discarded but are instead refilled from the global workset.

In the Galois system, the specification language is implemented as a library-based domain-specific language in Java. Each rule is represented by a Java class that implements the corresponding workset. FIG. 11 presents exemplary syntax of AS1 for PFP in accordance with aspects described herein. FIG. 12 presents exemplary general syntax of a global rule (e.g., a composed global rule $G_1 G_2 \ldots$) and a local rule (e.g., a composed local rule $L_1 L_2 \ldots$) in accordance with aspects described herein. The sequence of method calls produces an AST that is passed to the workset synthesizer (e.g., synthesizer unit 1720).

Additionally, advantage is taken of the semantics of rules to choose optimized workset implementations. Exemplary optimizations comprise: (I) Use Serial: As described, the inner worksets used by ChunkedFIFO and ChunkedLIFO are thread-local. The worksets generated from the local part of a specification are also thread-local. Thread-local worksets can be implemented with non-concurrent data structures that are typically more efficient than concurrent ones. (II) Ignore Size: In certain cases, worksets require inner worksets to maintain an estimate of the number of items they contain. The chunked worksets use this to keep track of when a chunk is full. The Ordered workset uses these sizes to implement commutativity conditions. This overhead may be significant in concurrent worksets because keeping track of sizes may require atomic increments. When sizes are not needed, the size metadata and effort maintaining it may be removed. (III) Use Bounded: When a chunked workset is used, each inner workset can be no larger than the chunk size. The inner worksets can be optimized for a bounded size rather than using dynamically sized data structures.

The synthesizer applies rewrite rules over the AST to detect the above cases and selects, if possible, implementations that are non-concurrent, do not keep track of their size or are bounded. In one aspect, to implement such optimizations, the synthesizer can introduce new rules (e.g., classes) to represent serial implementations of all the rules and bounded size implementations of the FIFO, LIFO, and Random rules. The synthesizer also can add an ignore size parameter to each rule, wherein the value (which can be logical, numerical, or otherwise) of the ignore size parameter determines if the implementation keeps track of its size. Then, the synthesizer can traverse the AST while performing the actions of (1) re-writing any rule after a chunked rule to use its serial implementation, (2) re-writing only rules after an Ordered rule to keep track of their sizes, and (3) re-writing rules after a chunked rule to use bounded implementations if possible, using the chunk size as the bound.

Table I illustrates the impact of such optimizations for the PFP application and a synthesized scheduler which is generated in accordance with aspects of the subject disclosure, the synthesizer is referred to as BASE. Positive numbers indicate slow-down of an optimization combination relative to all optimizations toggled ON. It is noted that this application and synthesized scheduler are employed for benchmarking because all the optimizations described herein can be applied, and the amount of work done per workset item is small, which increases the relative impact of an efficient workset implementation. Results in Table I reveal that these optimizations on worksets have a significant and mostly beneficial impact on single-threaded and multi-threaded performance.

TABLE I

Relative difference in percent (%) of the runtime of PFP and BASE scheduler on Multicore Architecture B as a function of synthesizer optimizations (+: ON, −: OF) relative to all optimizations on for one and eight threads. Letter "t" indicates number of threads.

| Ignore Size | Use Serial | Use Rounded | t = 1 | t = 8 |
|---|---|---|---|---|
| + | + | + | 0.0 | 0.0 |
| − | + | + | 0.8 | 12.1 |
| + | − | + | 2.4 | 5.5 |
| − | − | + | 7.8 | 7.7 |
| + | + | − | 3.6 | 3.5 |
| − | + | − | 11.3 | 11.5 |
| + | − | − | 5.0 | 16.8 |
| − | − | − | 2.9 | 17.5 |

Exemplary Application Cases and Performance Assessment

The exemplary irregular algorithms described herein were implemented and parallelized using the Galois system. FIG. 13 presents datasets utilized for various applications in accordance with aspects of the subject disclosure. In one aspect, the shortest-path application utilizes atomic compare-and-set operations to update distances. In another aspect, the currently distributed implementation exploits abstract locks, but compare-and-set operations generally are much faster for the shortest-path application. In certain embodiments, a Galois system is adapted (e.g., designed and compiled) to support scheduler specifications and synthesis methodology described herein. To assess performance of scheduler synthesis as described herein, each exemplary algorithm disclosed herein were executed in a multicore architecture with the following set of schedulers.

BASE: This is the default scheduler used by the Galois system. In an embodiment, the BASE scheduler is a synthesized ChunkedFIFO with a chunk-size of 32. In an aspect, each chunk is a thread-local LIFO.

FIFO, LIFO, RANDOM (RAND): These schedulers are synthesized from the final rules FIFO, LIFO and Random. Application-specific (AS) schedulers typically use one of these schedulers as their lowest-level (final) scheduler.

WS-L, WS-F: These schedulers are work-stealing (WS) with local LIFOs (WS-L) and FIFOs (WS-F), respectively. For benchmarking purposes, in certain embodiments, these schedulers were ported directly from the Fork-Join implementation in JSR166 and should appear in Java JDK 7.

BS-L, BS-F: These schedulers use a bulk-synchronous (BS) strategy with global LIFOs (BS-L) and FIFOs (BS-F) respectively. In certain embodiments, a barrier is utilized to safely swap between queues concurrently.

AS1, AS2: These schedulers are synthesized from the application specific (AS) scheduling specifications disclosed in FIG. 8.

Computational experiments to assess concurrent scheduler performance can be conducted in most any multicore architecture. In the subject disclosure, such computational experiments were performed in three exemplary multicore architectures:

Multicore Architecture A: A Sun Fire X2270 machine running Ubuntu Linux 8.04.4 LTS 64-bit. This architecture comprises two 4-core 2.93 GHz Intel Xeon X5570 (Nehalem) processors. The two CPUs share 24 GB of main memory. Each core has a 32 KB L1 cache and a unified 256 KB L2 cache. Each processor has an 8 MB L3 cache that is shared among the cores. This exemplary multicore architecture is referred to as Nehalem.

Multicore Architecture B: A machine also running Ubuntu Linux 8.04.4 LTS 64-bit. This architecture comprises four 4-core 2.7 GHz AMD Opteron 8384 (Shanghai) processors. Each core has a 64 KB L1 cache and a 512 KB L2 cache. Each processor has a 6 MB L3 cache that is shared among the cores. This exemplary multicore architecture is referred to as Shanghai.

Multicore Architecture C: A Sun T5440 machine running SunOS 5.10. This architecture comprises four 8-core 1.4 GHz Sun UltraSPARC T2 Plus (Niagara 2) processors. Each processor has a 4 MB L2 cache that is shared among the cores. This exemplary multicore architecture is referred to as Shanghai.

In certain embodiments, Sun JDK 1.6.0 21 is utilized to compile and execute the programs (e.g., groups of computer-executable instructions) with a heap size of 20 GB. In an aspect, to control for just-in-time (JIT) compilation, each application is executed four times within substantially the same Java virtual machine (JVM) instance and report only the last run.

In one aspect, the Galois system utilizes speculative parallelization, which can introduce overheads from (i) using concurrent implementations of data structures and schedulers rather than their sequential counterparts, (ii) acquiring locks to guarantee disjointness of neighborhoods, and (iii) recording undo actions to implement rollback. In another aspect, the serial version of an application can utilize sequential data structures only and does not acquire locks or perform undo actions. Difference in performance between a serial version and a parallel one-threaded version is the overhead of enabling speculative execution but not utilizing it. Such overhead can be significant for applications with short activities like PFP and SSSP.

Table H presents runtimes for serial applications, whereas Table III presents the parallelization speedup over the best performing serial scheduler (displayed in bold in Table H). The runtimes for PTA exclude time to read input, perform offline-cycle detection and write results. Such implementation differs from at least one conventional solution that includes the time to perform offline-cycle detection. For all other applications assessed herein, runtimes exclude time to read input data or write results but can include sections of the application that are not parallelized. It should be appreciated that this portion of time is usually negligible, but for DT with the AS1 scheduler, this includes time to construct the oct-tree.

TABLE II

Runtimes of serial versions in seconds.

|      | BASE   | RAND   | LIFO    | FIFO   | WS-L    | WS-F   | BS-L   | BS-F   | AS2   | AS1    |
|------|--------|--------|---------|--------|---------|--------|--------|--------|-------|--------|
|      |        |        |         |        | Nehalem |        |        |        |       |        |
| DMR  | 12.88  | 14.80  | 11.45 | 13.09  | 11.51   | 13.27  | 12.76  | 13.17  | 15.56 | 11.62  |
| DT   | 25.04  |        |         |        |         | 25.42  |        |        |       | 14.78 |
| PFP  | 110.93 | 109.77 | 169.86  | 115.40 | 173.47  | 116.44 | 110.18 | 118.59 |       | 45.94 |
| PTA  | 13.87  | —      | —       | 12.58 | —    | 12.74  | 20.26  | 12.84  |       |        |
| SSSP | —      | —      | —       | —      | —       | —      | —      | —      | 7.66  | 4.96 |
|      |        |        |         |        | Shanghai |       |        |        |       |        |
| DMR  | 16.29  | 19.52  | 13.55 | 16.76  | 13.74   | 16.76  | 16.25  | 16.71  | 19.59 | 13.64  |
| DT   | 43.40  |        |         |        |         | 43.55  |        |        |       | 27.86 |
| PFP  | 237.04 | 210.57 | 320.24  | 237.17 | 314.53  | 234.13 | 216.50 | 217.67 |       | 74.26 |
| PTA  | 19.99  | —      | —       | 18.80  | —       | 18.79 | 26.44 | 18.82 |       |        |
| SSSP | —      | —      | —       | —      | —       | —      | —      | —      | 11.08 | 9.53 |
|      |        |        |         |        | Niagara |        |        |        |       |        |
| DMR  | 61.76  | 68.10  | 54.79   | 63.51  | 53.84 | 63.31 | 62.86 | 64.17 | 77.81 | 60.33  |
| DT   | 178.21 |        |         |        |         | 179.00 |        |        |       | 149.42 |
| PFP  | 787.05 | 734.27 | 1264.61 | 741.01 | 1297.71 | 775.04 | 720.20 | 827.07 |       | 342.41 |
| PTA  | 59.17  | —      | —       | 57.73  | —       | 57.30  | 76.16  | 56.99 |   |        |
| SSSP | —      | —      | —       | —      | —       | —      | —      | —      | 33.84 | 23.35 |

Conveyed in boldface are the best serial times achieved, which are the basis for the speed-up information disclosed in Table 3. Entries represented with a dash ("—") timed out. Blank entries indicate invalid or redundant combinations.

Empty entries (represented with a dash) indicate combinations of schedulers and applications that would either be redundant or perform significantly worse (by an order of magnitude or more) than the best serial version. For DT, the performance without randomizing the initial points is substantially worse than with randomization. In one aspect, since the application does not create any new tasks, BASE and WS-L schedulers are evaluated after including a timed phase that randomizes the input points: It is noted that other non-random schedulers are omitted because they perform similarly after including this phase. For PTA, the RAND, LIFO and WS-L schedulers timed out. For SSSP, only the AS1 and AS2 schedulers are competitive.

TABLE III

Speed-up over serial versions.

|      | BASH | RAND | LIFO | FIFO | WS-L | WS-F | BS-L | BS-F | AS2  | AS1   |
|------|------|------|------|------|------|------|------|------|------|-------|
|      |      |      |      |      | Nehalem (t ≤ 8) |      |      |      |      |       |
| DMR  | 5.70 | 4.82 | 0.95 | 3.81 | 4.35 | 5.13 | 2.64 | 3.53 | 2.01 | 6.15 |
| DT   | 2.21 |      |      |      |      | 2.09 |      |      |      | 2.35 |
| PFP  | 1.30 | 0.71 | 0.20 | 1.15 | 0.72 | 2.30 | 0.37 | 0.89 |      | 3.35 |
| PTA  | 2.83 | —    | —    | 3.53 | —    |      | 2.05 | 2.37 | 3.77 |  |
| SSSP | —    | —    | —    | —    | —    | —    | —    | —    | 0.61 | 3.16 |
|      |      |      |      |      | Shanghai (t ≤ 16) |    |      |      |      |       |
| DMR  | 7.85 | 3.43 | 0.95 | 3.74 | 6.94 | 7.53 | 1.91 | 3.83 | 2.32 | 10.45 |
| DT   | 2.64 |      |      |      |      | 2.65 |  |      |      | 2.53  |
| PFP  | 1.28 | 0.62 | 0.20 | 1.00 | 0.65 | 2.19 | 0.37 | 0.74 |      | 2.56 |

TABLE III-continued

Speed-up over serial versions.

| | BASH | RAND | LIFO | FIFO | WS-L | WS-F | BS-L | BS-F | AS2 | AS1 |
|---|---|---|---|---|---|---|---|---|---|---|
| PTA | 3.69 | — | — | 3.63 | — | 3.08 | 3.25 | 5.03 | | |
| SSSP | — | — | — | — | — | — | — | — | 0.80 | 3.04 |
| Niagara (t ≤ 32) | | | | | | | | | | |
| DMR | 18.77 | 5.95 | 0.89 | 6.81 | 11.47 | 18.53 | 3.60 | 5.89 | 3.59 | 21.53 |
| DT | 5.43 | | | | | 5.48 | | | | 3.29 |
| PFP | 2.30 | 1.25 | 0.32 | 2.84 | 2.18 | 4.46 | 0.80 | 2.13 | | 5.92 |
| PTA | 4.20 | — | — | 4.49 | — | 5.42 | 4.62 | 6.16 | | |
| SSSP | — | — | — | — | — | — | — | — | 0.50 | 2.33 |

Conveyed in boldface are the best speedups achieved for each (application, machine) pair. Entries represented with a dash ("—") timed out. Blank entries indicate invalid or redundant combinations. Letter "t" indicates number of threads.

In one aspect, the available results reveal that the best scheduler for serial execution tends to be the best scheduler for parallel execution as well. Such finding supports the use case where end-users experiment with scheduling specifications within a sequential programming model and rely on a synthesis routine to generate efficient concurrent schedulers that closely maintain a desired scheduling during parallelized execution. In another aspect, the results convey large swings between best and worst schedulers. It should be appreciated that the missing entries for PFP, PTA and SSSP correspond to combinations that perform significantly worse than the recorded times. Selection of a non-suitable scheduler for a specific irregular algorithm can have a drastic impact on performance.

Performance assessment of schedulers synthesized in accordance with aspects of the subject disclosure reveals several features of scheduler synthesis. In one aspect, AS1 schedulers perform as well or better than any fixed-function scheduler for the same application (e.g., irregular algorithm). In addition, the BASE scheduler synthesized in accordance with aspects of the subject disclosure performs well across applications. In an aspect, such BASE scheduler is implemented by a global queue with fixed-size local stacks. In another aspect, a DMR scheduler can benefit from LIFO policies, whereas PFP, PTA and SSSP benefit from FIFO policies.

Results of performance assessment of the scheduler of the subject specification are similar, yet not identical, to certain conventional results for application-specific schedulers on similar inputs for PFP, PTA, and SSSP. Accordingly, it is readily apparent that automated scheduler synthesis based on generation of scheduling specification in accordance with aspects described herein can supply efficient schedulers with substantially less expenditure of human resources (e.g., software developer time) devoted to explicitly developing handcrafted parallel code. For certain schedulers (e.g., FIFO and LIFO workset implementations), additional efficiencies can be accomplished by memory-level optimization.

Figure 14:
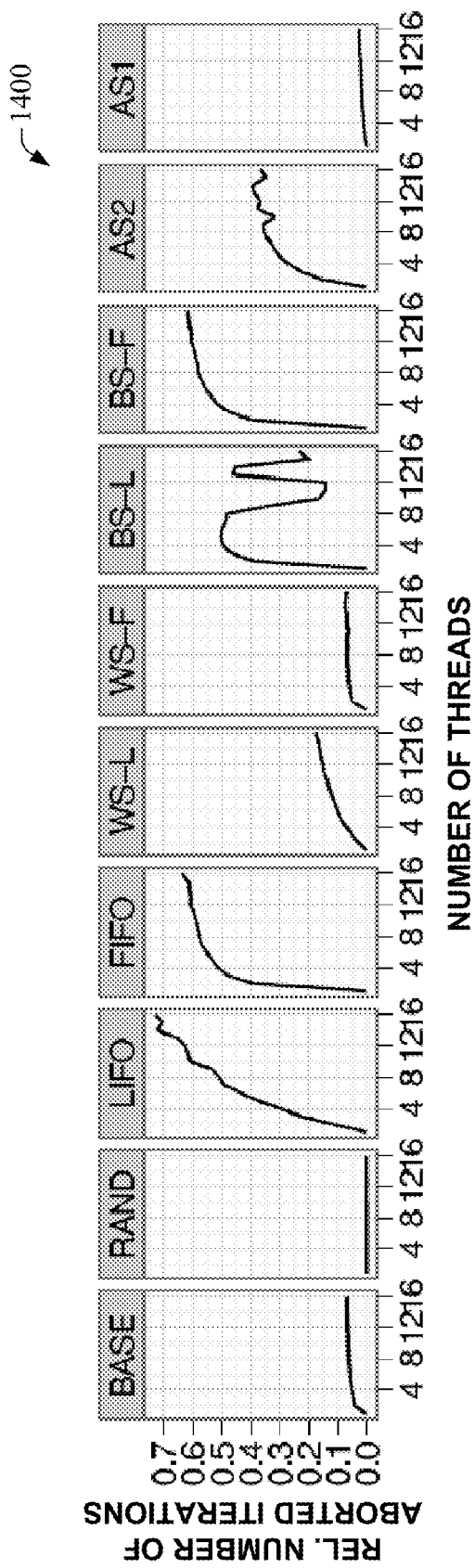
FIG. 14 displays exemplary aspects of performance of an illustrative irregular algorithm executed in an illustrative multicore architecture in accordance with aspects described herein.

Results of the performance assessment of the schedulers of the subject disclosure present the following aspects. Delaunay Mesh Refinement. Table II conveys that for the serial implementation, the best performance is obtained by the LIFO scheduler. In one aspect, when a bad triangle is repaired, such reparation it may create a set of new bad triangles whose cavities overlap with the cavity of the original bad triangle. The LIFO scheduler can exploit the potential temporal and spatial locality. Yet, both of the global LIFO scheduling policies (e.g., LIFO and BS-L) perform poorly in a parallel setting because the probability of conflicts (e.g., collusion) increases if triangles close to each other in the mesh are processed speculatively in a parallel implementation of the DMR algorithm. FIG. 14 illustrates number of aborted to total iterations relative to total number of iterations in a Delaunay mesh refinement (DMR)) of an illustrative irregular algorithm executed in an illustrative multicore architecture (Multicore Architecture A) in accordance with aspects described herein—result trends are similar for Multicore Architecture B and Multicore Architecture C. Global FIFO schedulers behave in substantially the same way. The BASE scheduler, which uses a global FIFO, ameliorates performance issues arising from conflicts by distributing chunks of work to each thread.

For the DMR algorithm, the AS1 scheduler exhibits the best performance. Such scheduler is implemented by a global workset processed in chunked FIFO order and local worksets maintained in LIFO order. Such implementation, accomplished automatically in accordance with aspects described herein, enables exploitation of locality while controlling the abort ratio, as disclosed in FIG. 14.

Figure 15:
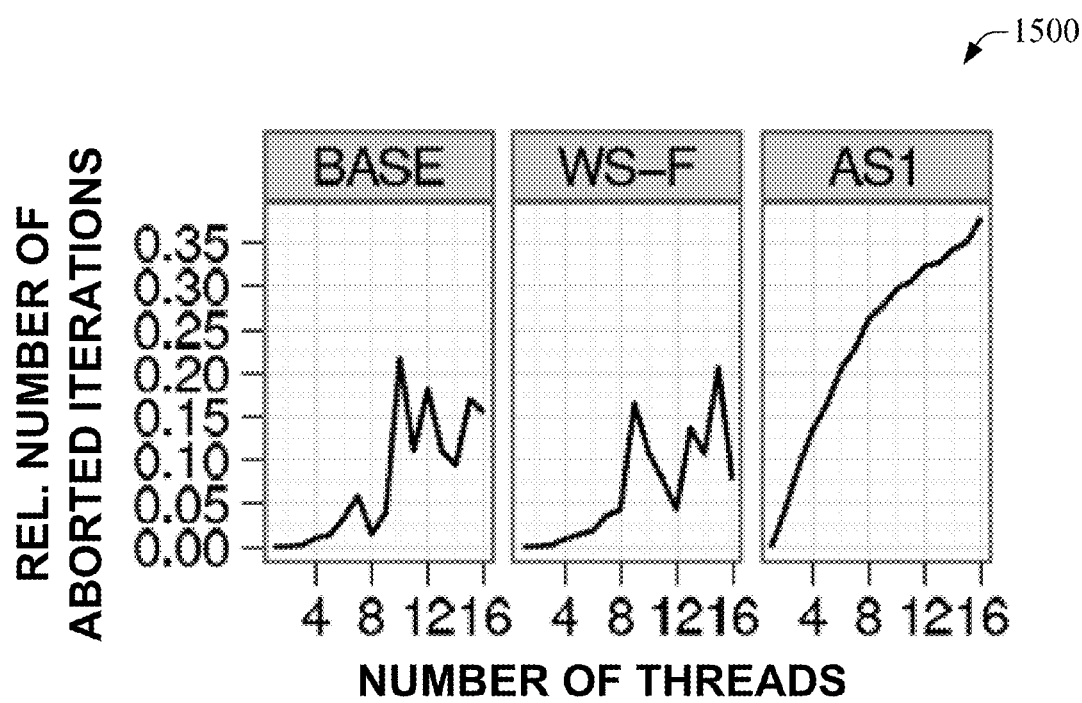
FIG. 15 displays exemplary aspects of performance of an illustrative irregular algorithm executed in the illustrative multicore architecture referred to in FIG. 14 in accordance with aspects described herein.

Delaunay Triangulation. DT generally does not create any new work. Performance of the DT is governed by the initial work order, which commonly is randomized for best algorithmic performance. In one aspect, with randomization, the BASE and WS-L schedulers synthesized in accordance with aspects described herein perform similarly. For an AS1 generated in accordance with aspects of the subject disclosure is significantly faster than the other two schedulers for serial execution. Yet, difference if performance tends to vanish as the number of threads employed in parallelized execution is increased. It should be appreciated that the AS1 scheduler is designed to increase spatial locality between activities. In speculative parallel execution, such scheduling strategy causes the abort ratio to increase—such feature can be gleaned from results presented in FIG. 15.

Figure 16:
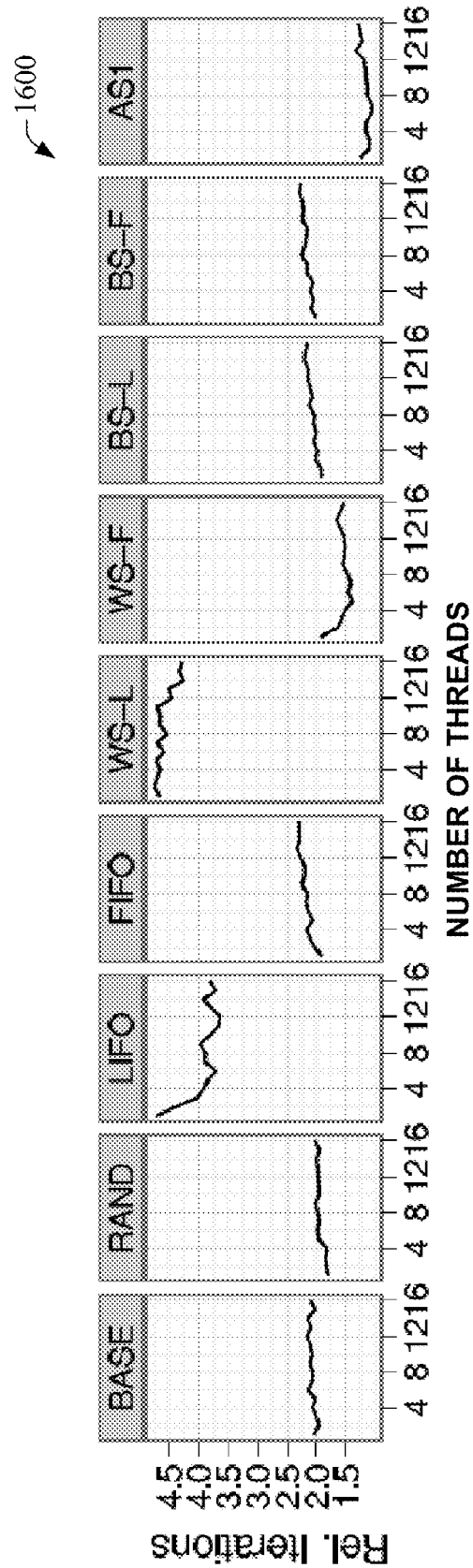
FIG. 16 displays exemplary aspects of performance of an illustrative irregular algorithm executed in the illustrative multicore architecture referred to in FIG. 14 in accordance with aspects described herein.

Preflow-push. PFP is an example of an algorithm with a performance that is highly schedule-dependent because different schedulers result in substantially different amounts of work. FIG. 16 illustrates number of aborted iterations relative to total number of iterations in a PFP algorithm executed in Multicore Architecture B in accordance with aspects described herein. Most schedulers synthesized in accordance with aspects of the subject disclosure result in twice as many iterations as the best serial version; in certain scenarios, LIFO and WS-L perform nearly four times more iterations. Table II shows the impact of the varying work on the serial versions. In one aspect, the runtime of the fastest and slowest schedulers differ by a factor of more than three. For a conventional, handcrafted parallelized implementation of PFP exploiting the heuristics described herein, a maximum speed-up of about 2 is achieved with eight processors on an Ultra-SPARC II architecture with an input similar to that utilized in the computational experiments presented herein.

Inclusion-based Points-to Analysis. PTA algorithm is another example of a highly schedule-dependent algorithm. The PTA algorithm can perform a fixpoint computation, and for these computations, FIFO policies generally perform well because a variable can accumulate several updates before the variable's value is propagated down-stream. In contrast, LIFO policies perform poorly and most versions typically time out. BS-F, which alternates between two queues, outperforms other schedulers on the input data supplied to the PTA, e.g., data generated by execution of the Gimp program (see FIG. 13). On other inputs (not shown), BASE can outperform BS-F.

Single-source Shortest-path. SSSP is a case where the generally accepted as best serial scheduler, which is AS2 and is based on Dijkstra's algorithm, fails to perform well in a parallel execution environment. While SSSP has better theoretical algorithmic complexity, a concurrent priority queue can limit performance on most inputs. The difficulty in implementing such queues is one source for the delta-stepping order (AS1), which attempts to balance good order with efficient concurrent implementation. Computational experiments (not shown) convey that the delta-stepping order performs about 1.2 times more work than Dijkstra's algorithm for input related to SSSP. Such overhead is sufficiently low to be overcome through parallelism.

Certain conventional implementations of delta-stepping can be accomplished for the Cray MTA-2 architecture. On the same input utilized here (e.g., a road network of the western United States; see FIG. 13) such implementations exhibit a maximum speedup of about two (2) on sixteen processors.

Figure 17:
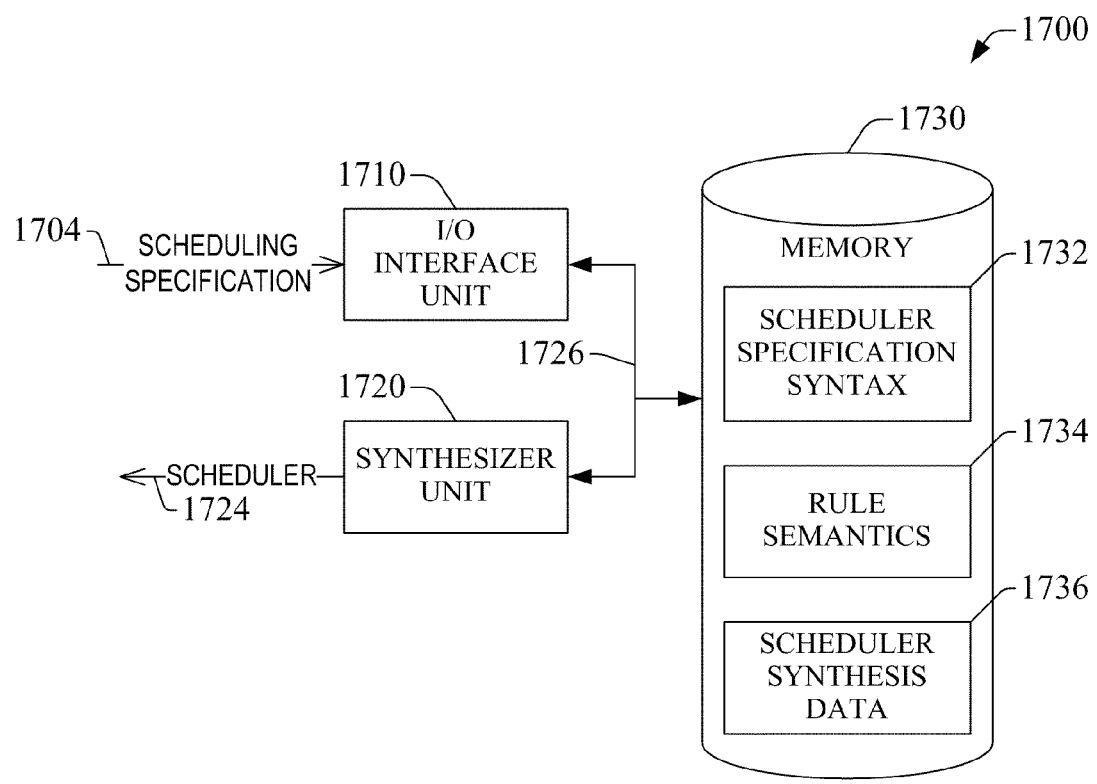
FIG. 17 is an exemplary system for synthesis of a concurrent scheduler in accordance with aspects described herein.

Systems that can enable the various aspects disclosed herein can be comprised of units. It can be appreciated that this is a functional description and that the respective functions can be performed by software, hardware, or a combination of software and hardware. A unit can be software, hardware, or a combination of software and hardware. FIG. 17 illustrates a block diagram of an exemplary system 1700 for synthesis of a concurrent scheduler in accordance with aspects of the subject disclosure. A scheduling specification 1704 is supplied, via input/output (I/O) interface 1710, to a synthesizer unit 1720 (also referred to as synthesizer 1720). The scheduling specification 1704 specifies a desired algorithmic order (e.g., a work-sharing strategy) for performing an irregular algorithm. As described herein, the scheduling specification 1704 is provided according to a scheduler specification syntax (see, e.g., FIG. 6) which can be retained in memory 1730 as a scheduler specification syntax memory element 1732, which can include a non-empty set of ordering rules (e.g., global, local, final, non-final . . . ), syntax elements to define a rule as global or local (see, e.g., FIG. 6), a non-empty set of mapping functions (e.g., $f_D$, $f_M$). A bus 1726 functionally couples the I/O interface 1710, the synthesizer unit 1720, and memory 1730. I/O In one aspect, the synthesizer unit 1720 automatically maps the scheduling specification 1704 into an implementation thereof, such as scheduler 1724. In another aspect, synthesizer unit 1720 can add scheduler 1724 to a high-level scheduler specification language (e.g., syntax in FIG. 6 and semantics in FIG. 7) and utilize scheduler 1724 for synthesis of other schedulers. Thus, the specification language described herein can be extensible and re-usable.

In one aspect, the synthesizer unit 1720 can incorporate optimizations into generation of the implementation of the scheduling specification 1704. Scheduler synthesis data 1736 can comprise data representative of features scheduling strategies (e.g., chunk sizes of worksets) or optimization thereof (e.g., bounded size for a chunked workset). In certain scenarios, the scheduler 1724 can be supplied to other system (runtime system, autotuning system, etc.) for utilization in performance of one or more irregular algorithms.

As described herein, FIG. 11 illustrates an exemplary implementation of AS1 for PFP. It is readily appreciated that such automated mapping permits scheduling policies, such as a work-sharing strategies, to be specified straightforwardly. Scheduling specifications defined through the scheduler specification syntax 1732 (e.g., syntax in FIG. 6) afford implementation of scheduling strategies that can be substantially more expressive or sophisticated than scheduling strategies that are directly handcrafted into a scheduler.

Figure 18:
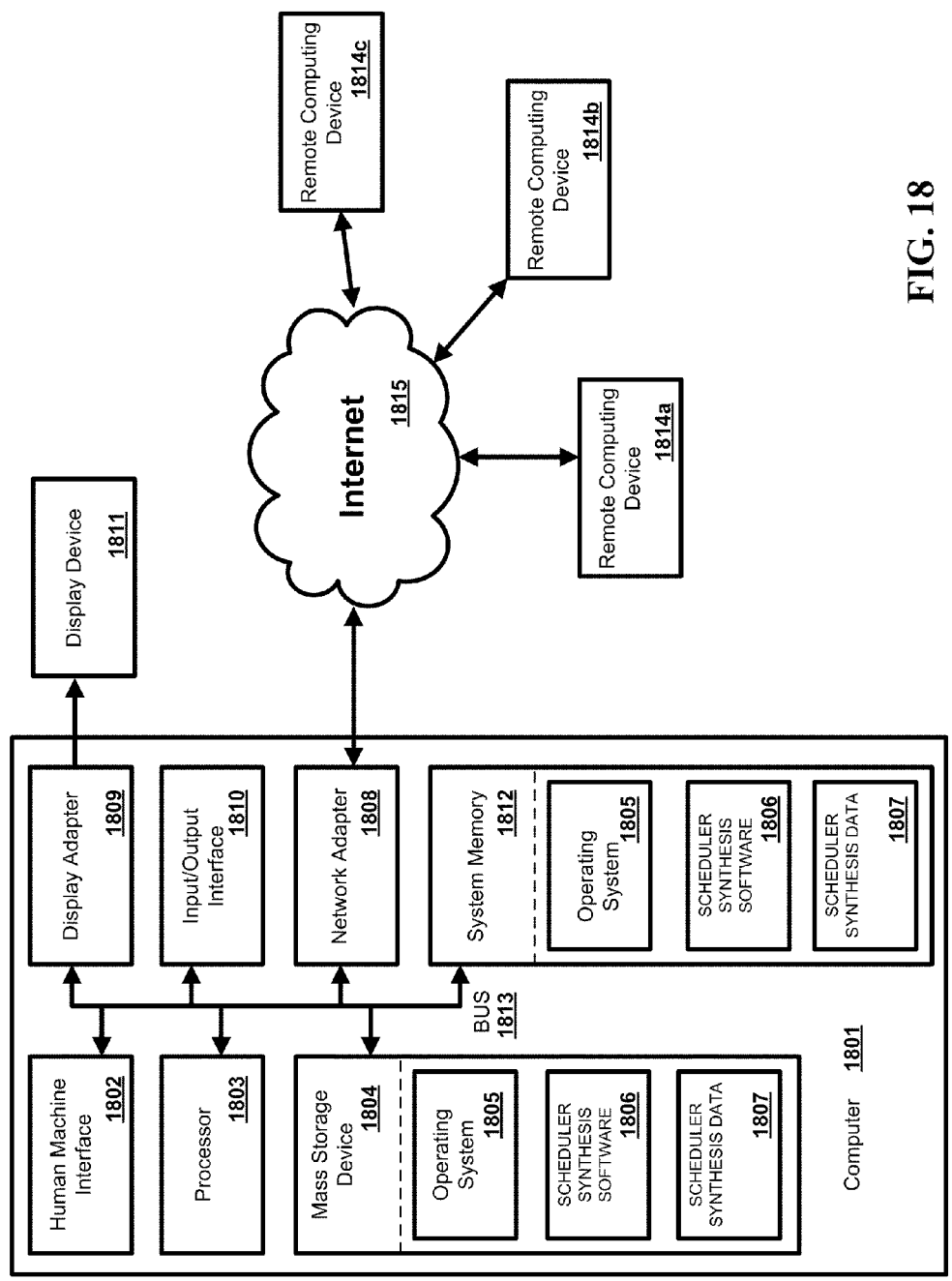
FIG. 18 is an exemplary operating environment for synthesis of a concurrent scheduler based at least on a scheduling specification in accordance with aspects described herein.

In additional or alternative embodiments of systems that enable synthesis of a concurrent scheduler in accordance with aspects of the subject disclosure, the units can comprise the scheduling synthesis software 1806 and scheduler synthesis data 1807, as illustrated in FIG. 18 and described herein. In one aspect, scheduling synthesis software 1806 can be the high-level language described herein and illustrated in FIGS. 6-7; the scheduler synthesis data 1807 can retain scheduling policies and scheduling specifications. In another aspect, the units can comprise a computer 1801 as illustrated in FIG. 18 and described below. In one embodiment, a processor 1803 can execute at least a portion of scheduling synthesis software 1806 in order to synthesize a concurrent scheduler in accordance with aspects described herein. In one aspect, computer-executable instructions that are part of scheduling synthesis software 1806 can configure the processor 1803 to perform various operations or acts, such operations or act comprising receiving a scheduling specification for an irregular algorithm, the scheduling specification representing a scheduling policy encoded according to a scheduler specification syntax; and synthesizing a scheduler for executing the irregular algorithm based on the scheduling specification. In another aspect, to perform the receiving act, the processor 1803 can perform the act of receiving at least one ordering rule, wherein the at least one ordering rule specifies a total order for processing a plurality of items. In certain scenarios, to perform the act of receiving the at least one ordering rule, the processor 1803 can perform the act of receiving a sequentially composed ordering rule, wherein to perform the act of receiving a sequentially composed ordering rule, the processor performs the act of receiving at least one of a non-final final rule or a final rule. In other scenarios, wherein to perform the act of receiving the at least one ordering rule, the processor 1803 can perform the act of receiving a global ordering rule and a local ordering rule, wherein the global ordering rule is applied to an initial group of items of a global workset of the irregular algorithm, and the local ordering rule is applied to each thread-local workset of a group of thread-local worksets of the irregular algorithm.

In an additional or alternative aspect, to perform the synthesizing operation or act, the processor 1803 can perform the operation or act of implementing the at least one rule by defining one or more workset objects, a workset object of the one or more workset objects having an addition method, a first poll method, and a second poll method. As described herein, in one aspect, the addition method comprises a definition for adding an item to the workset object. In another aspect, the first poll method comprises a definition for returning (i) a null value distinct from all items added to the workset object and (ii) a first item being previously added to the workset object in response to invocation of the addition method. In yet another aspect, the second poll method comprises a definition for returning (a) the null value only when the workset object is empty and (b) a second item being previously added to the workset object in response to invocation of the addition method. In a further aspect, concurrent execution of the second poll method and an invocation of a disparate method is avoided, and invocation of the second poll method is avoided when a pending invocation of a method is present.

In certain scenarios, to perform the defining operation or act associated with implementing the at least one rule, the processor 1803 can perform the operation or act of generating at least one class representative of the one or more workset objects. In additional or alternative scenarios in which optimization of the synthesis of concurrent schedulers is effected, performance by processor 1803 of the implementing operation or act yields an implementation of the at least one rule and, to perform the implementing operation or act, the processor 1803 can perform the act of modifying the implementation of the at least one rule by performing one or more of replacing a first rule of the at least one rule with a serial instance of the first rule, tracking a size of a second rule of the at least one rule, or maintaining a size of a third rule of the at least one rule below an upper-bounded size.

FIG. 18 is a block diagram illustrating an exemplary operating environment for synthesis of a concurrent scheduler based at least on a scheduling specification in accordance with aspects described herein. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components or firmware components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, it can be appreciated that the systems and methods disclosed herein can be implemented via a general-purpose computing device in the form of a computer 1801. The components of the computer 1801 can comprise, but are not limited to, one or more processors or processing units 1803, a system memory 1812, and a system bus 1813 that couples various system components including the processor 1803 to the system memory 1812. In the case of multiple processing units 1803, the system can utilize parallel computing.

The system bus 1813 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 1813, and all buses specified in this description can also be implemented over a wired or wireless network connection and each of the subsystems, including the processor 1803, a mass storage device 1804, an operating system 1805, scheduler synthesis software 1806, scheduler synthesis data 1807, a network adapter 1808, system memory 1812, an Input/Output Interface 1810, a display adapter 1809, a display device 1811, and a human machine interface 1802, can be contained within one or more remote computing devices 1814*a,b,c* at physically separate locations, connected through buses of this form, in effect implementing a fully distributed system.

In one aspect, the processor 1803 and system memory 1812, which comprises the scheduler synthesis software 1806 and scheduler synthesis data 1807, can embody a synthesizer unit (also referred to as a synthesizer) that can generate a concurrent scheduler in accordance with aspects described herein.

The computer 1801 typically comprises a variety of computer readable media. Exemplary readable media can be any available media that is accessible by the computer 1801 and comprises, for example and not meant to be limiting, both volatile and non-volatile media, removable and non-removable media. The system memory 1812 comprises computer readable media in the form of volatile memory, such as random access memory (RAM), and/or non-volatile memory, such as read only memory (ROM). The system memory 1812 typically contains data such as Work-sharing data 1807 and/or program modules such as operating system 1805 and Work-sharing software 1806 that are immediately accessible to and/or are presently operated on by the processing unit 1803.

In another aspect, the computer 1801 can also comprise other removable/non-removable, volatile/non-volatile computer storage media. By way of example, FIG. 18 illustrates a mass storage device 1804 which can provide non-volatile storage of computer code, computer readable instructions, data structures, program modules, and other data for the computer 1801. For example and not meant to be limiting, a mass storage device 1804 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 1804, including by way of example, an operating system 1805 and Work-sharing software 1806. Each of the operating system 1805 and Work-sharing software 1806 (or some combination thereof) can comprise elements of the programming and the Work-sharing software 1806. Work-sharing data 1807 can also be stored on the mass storage device 1804. Work-sharing data 1807 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 1801 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 1803 via a human machine interface 1802 that is coupled to the system bus 1813, but can be connected by other interface and bus structures, such as a parallel port, game port, an IEEE 1394 Port (also known as a Firewire port), a serial port, or a universal serial bus (USB).

In yet another aspect, a display device 1811 can also be connected to the system bus 1813 via an interface, such as a display adapter 1809. It is contemplated that the computer 1801 can have more than one display adapter 1809 and the computer 1801 can have more than one display device 1811. For example, a display device can be a monitor, an LCD (Liquid Crystal Display), or a projector. In addition to the display device 1811, other output peripheral devices can comprise components such as speakers (not shown) and a printer (not shown) which can be connected to the computer 1801 via Input/Output Interface 1810. Any step and/or result of the methods can be output in any form to an output device. Such output can be any form of visual representation, including, but not limited to, textual, graphical, animation, audio, tactile, and the like.

The computer 1801 can operate in a networked environment using logical connections to one or more remote computing devices 1814*a,b,c*. By way of example, a remote computing device can be a personal computer, portable computer, a server, a router, a network computer, a peer device or other common network node, and so on. Logical connections between the computer 1801 and a remote computing device 1814*a,b,c* can be made via a local area network (LAN) and a general wide area network (WAN). Such network connections can be through a network adapter 1808. A network adapter 1808 can be implemented in both wired and wireless environments. Such networking environments are conventional and commonplace in offices, enterprise-wide computer networks, intranets, and the Internet 1815.

For purposes of illustration, application programs and other executable program components such as the operating system 1805 are illustrated herein as discrete blocks, although it is recognized that such programs and components reside at various times in different storage components of the computing device 1801, and are executed by the data processor(s) of the computer. An implementation of Work-sharing software 1806 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

Figure 19:
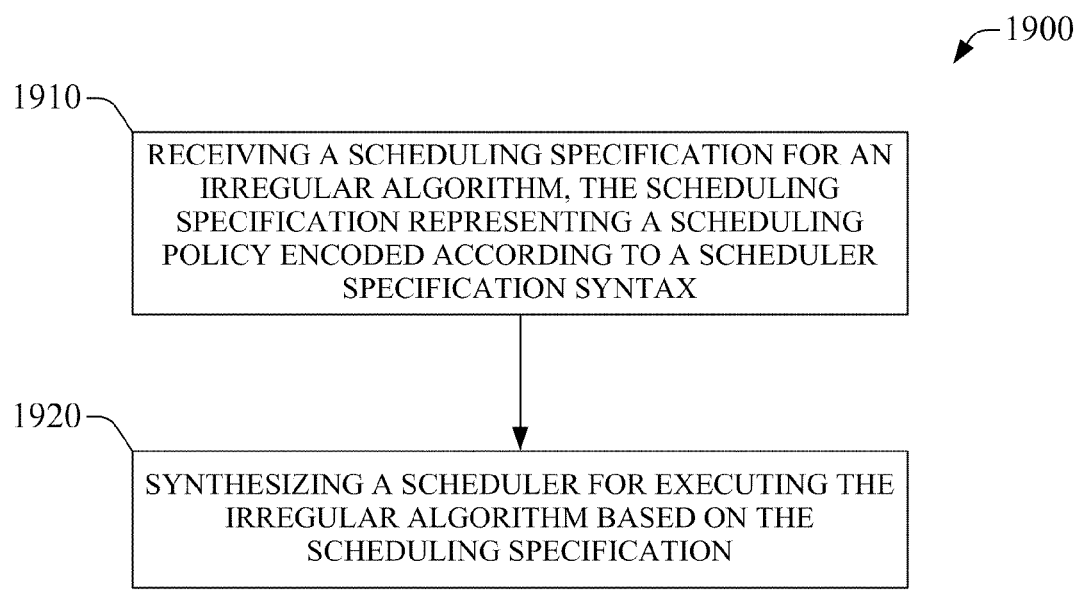
FIG. 19 illustrates an exemplary method for generating a scheduler based at least on a scheduling specification in accordance with aspects described herein.

In view of the various aspects described herein, a methodology for synthesizing a concurrent scheduler from a scheduling specification can comprise the exemplary method 1900 presented in FIG. 19. In an embodiment, the synthesizer unit described herein can implement (e.g., execute) the exemplary method 1800. At act 1810, a scheduling specification for an irregular algorithm (e.g., DT, DMR, PTA, PFP, SSSP, or the like) can be received. As described herein, the scheduling specification can represent a scheduling policy encoded according to a scheduler specification syntax. In one aspect, the receiving act comprises receiving at least one ordering rule, wherein the at least one ordering rule specifies a total order for processing a plurality of items. In another aspect, receiving the at least one ordering rule comprises receiving a sequentially composed ordering rule, wherein receiving the sequentially composed ordering rule comprises receiving at least one of a non-final final rule or a final rule. In yet another aspect, receiving the at least one ordering rule comprises receiving a global ordering rule and a local ordering rule, wherein the global ordering rule is applied to an initial group of items of a global workset of the irregular algorithm, and the local ordering rule is applied to each thread-local workset of a group of thread-local worksets of the irregular algorithm.

At act 1820, a scheduler for executing the irregular algorithm is synthesized based on the scheduling specification. It should be appreciated that, in contrast to conventional protocols, the scheduler is not handwritten but rather synthesized as described herein. In an aspect, the synthesizing act comprises implementing the at least one rule by defining one or more workset objects, a workset object of the one or more workset objects having an addition method, a first poll method (e.g., poll method described herein), and a second poll method (e.g., poll-s method described herein). In another aspect, the addition method comprises a definition for adding an item to the workset object, the first poll method comprises a definition for returning (i) a null value distinct from all items added to the workset object and (ii) a first item being previously added to the workset object in response to invocation of the addition method, and the second poll method comprises a definition for returning (a) the null value only when the workset object is empty and (b) a second item being previously added to the workset object in response to invocation of the addition method, and further wherein concurrent execution of the second poll method and an invocation of a disparate method is avoided, and invocation of the second poll method is avoided when a pending invocation of a method is present. In certain embodiments, defining the one or more workset objects can comprise generating at least one class representative of the one or more workset objects.

As described herein, various optimization can be incorporated into synthesis of the concurrent scheduler. In certain embodiments, such optimizations can be effected by implementing the at least one rule by defining the one or more workset objects as described herein. In one aspect, the implementing act yields implementation of the at least one rule, and comprises modifying the implementation of the at least one rule by performing one or more of replacing a first rule of the at least one rule with a serial instance of the first rule, tracking a size of a second rule of the at least one rule, or maintaining a size of a third rule of the at least one rule below an upper-bounded size.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including matters of logic with respect to arrangement of steps or operational flow; plain meaning derived from grammatical organization or punctuation; the number or type of embodiments described in the specification.

It should be further appreciated that the exemplary methods disclosed throughout the subject specification can be stored on an article of manufacture, or computer-readable non-transitory storage medium, to facilitate transporting and transferring such methods to computers or other computing devices for execution and thus implementation by a processor, or for storage in a memory. In one embodiment, a computer-readable non-transitory storage medium of the subject disclosure can comprise a first group of computer-executable instructions that, in response to execution, cause a processor to receive a scheduling specification for an irregular algorithm, the scheduling specification representing a scheduling policy encoded according to a scheduler specification syntax; and a second group of computer-executable instructions that, in response to execution, cause a processor to synthesize a scheduler for executing the irregular algorithm based on the scheduling specification. In one aspect, the first group of computer-executable instructions comprises a third group of computer-executable instructions that, in response to execution, cause the processor to receive at least one ordering rule, wherein the at least one ordering rule specifies a total order for processing a plurality of items, wherein the third group of computer-executable instructions, in response to execution, further cause the processor to receive a sequentially composed ordering rule. In another aspect, the second group of computer-executable instructions comprises a fourth group of computer-executable instructions that, in response to execution, cause the processor to implement the at least one rule through definition of one or more workset objects, a workset object of the one or more workset objects having an addition method, a first poll method, and a second poll method, wherein the addition method comprises a definition for adding an item to the workset object, the first poll method comprises a definition for returning (i) a null value distinct from all items added to the workset object and (ii) a first item being previously added to the workset object in response to invocation of the addition method, and the second poll method comprises a definition for returning (a) the null value only when the workset object is empty and (b) a second item being previously added to the workset object in response to invocation of the addition method, and further wherein concurrent execution of the second poll method and an invocation of a disparate method is avoided, and invocation of the second poll method is avoided when a pending invocation of a method is present. In additional or alternative embodiments, execution of the fourth group of computer-executable instructions yields implementation of the at least one rule, and wherein the fourth group of computer-executable instructions comprises a fifth group of computer-executable instructions that, in response to execution, cause the processor to modify the implementation of the at least one rule by performing one or more of replacing a first rule of the at least one rule with a serial instance of the first rule, tracking a size of a second rule of the at least one rule, or maintaining a size of a third rule of the at least one rule below an upper-bounded size.

Conclusion

Scheduling order matters even in the sequential implementation of irregular algorithms. In the context of parallel implementations, conventional approaches to concurrent scheduling generally assume that activities are independent or that dependences are subsumed by fork-join control dependences, so current general-purpose runtime schedulers embody only a few simple scheduling policies. In contrast, handwritten concurrent schedulers for parallel implementations of irregular algorithms often utilize carefully crafted scheduling policies that trade-off excess work for increased parallelism. Yet such policies typically increase the burden of parallel programming and may be difficult to reuse for other algorithms.

In the subject disclosure, a solution to the problem of implementing concurrent scheduling by (1) developing a high-level specification language for schedulers, wherein the language permits generation of scheduling specification, and (2) developing a formalism for synthesis of an efficient concurrent scheduler from the scheduling specification. The solution permits application programmers to direct their attention to devising scheduling policies while delegating the typically tedious task of implementing the scheduling policy to a synthesizer and runtime system.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method, comprising:
  receiving, by a computing device, a scheduling specification for an irregular algorithm, the scheduling specification representing a scheduling policy encoded according to a scheduler specification syntax,
  wherein receiving comprises receiving at least one ordering rule, wherein the at least one ordering rule specifies a total order for processing a plurality of items,
  wherein receiving the at least one ordering rule comprises receiving a sequentially composed ordering rule; and
  synthesizing, by the computing device, a scheduler for executing the irregular algorithm based on the scheduling specification,
  wherein synthesizing comprises implementing the at least one ordering rule by defining one or more workset objects, a workset object of the one or more workset objects having an addition method, a first poll method, and a second poll method, wherein the addition method comprises a definition for adding an item to the workset object, the first poll method comprises a definition for returning (i) a null value distinct from all items added to the workset object and (ii) a first item being previously added to the workset object in response to invocation of the addition method, and the second poll method comprises a definition for returning (a) the null value only when the workset object is empty and (b) a second item being previously added to the workset object in response to invocation of the addition method, and further wherein concurrent execution of the second poll method and an invocation of a disparate method is avoided, and invocation of the second poll method is avoided when a pending invocation of a method is present.

2. The method of claim 1, wherein receiving the sequentially composed ordering rule comprises receiving at least one of a non-final rule or a final rule.

3. The method of claim 1, wherein receiving the at least one ordering rule comprises receiving a global ordering rule and a local ordering rule, wherein the global ordering rule is applied to an initial group of items of a global workset of the irregular algorithm, and the local ordering rule is applied to each thread-local workset of a group of thread-local worksets of the irregular algorithm.

4. The method of claim 1, wherein the defining act comprises generating at least one class representative of the one or more workset objects.

5. The method of claim 1, wherein the implementing act yields implementation of the at least one ordering rule, and comprises modifying the implementation of the at least one ordering rule by performing one or more of replacing a first rule of the at least one ordering rule with a serial instance of the first rule, tracking a size of a second rule of the at least one ordering rule, or maintaining a size of a third rule of the at least one ordering rule below an upper-bounded size.

6. A system, comprising:

a memory comprising computer-executable instructions; and a processor configured by the computer-executable instructions to perform acts comprising:

receiving a scheduling specification for an irregular algorithm, the scheduling specification representing a scheduling policy encoded according to a scheduler specification syntax, wherein to perform the receiving, the processor receives at least one ordering rule, wherein the at least one ordering rule specifies a total order for processing a plurality of items, wherein to perform the receiving the at least one ordering rule, the processor receives a sequentially composed ordering rule, wherein to perform the receiving a sequentially composed ordering rule, the processor receives at least one of a non-final final rule or a final rule; and synthesizing a scheduler for executing the irregular algorithm based on the scheduling specification, wherein to perform the synthesizing, the processor performs implements the at least one ordering rule by defining one or more workset objects, a workset object of the one or more workset objects having an addition method, a first poll method, and a second poll method, wherein the addition method comprises a definition for adding an item to the workset object, the first poll method comprises a definition for returning (i) a null value distinct from all items added to the workset object and (ii) a first item being previously added to the workset object in response to invocation of the addition method, and the second poll method comprises a definition for returning (a) the null value only when the workset object is empty and (b) a second item being previously added to the workset object in response to invocation of the addition method, and further wherein concurrent execution of the second poll method and an invocation of a disparate method is avoided, and invocation of the second poll method is avoided when a pending invocation of a method is present.

7. The system of claim 6, wherein to perform the act of receiving the at least one ordering rule, the processor performs the act of receiving a global ordering rule and a local ordering rule, wherein the global ordering rule is applied to an initial group of items of a global workset of the irregular algorithm, and the local ordering rule is applied to each thread-local workset of a group of thread-local worksets of the irregular algorithm.

8. The system of claim 6, wherein to perform the defining act, the processor performs the act of generating at least one class representative of the one or more workset objects.

9. The system of claim 6, wherein performance, by the processor, of the implementing act yields an implementation of the at least one ordering rule and, to perform the implementing act, the processor performs the act of modifying the implementation of the at least one ordering rule by performing one or more of replacing a first rule of the at least one ordering rule with a serial instance of the first rule, tracking a size of a second rule of the at least one ordering rule, or maintaining a size of a third rule of the at least one ordering rule below an upper-bounded size.

10. A computer-readable non-transitory storage medium, comprising:

a first group of computer-executable instructions that, in response to execution, cause a processor to receive a scheduling specification for an irregular algorithm, the scheduling specification representing a scheduling policy encoded according to a scheduler specification syntax, wherein the first group of computer-executable instructions comprises a third group of computer-executable instructions that, in response to execution, cause the processor to receive at least one ordering rule, wherein the at least one ordering rule specifies a total order for processing a plurality of items, wherein the third group of computer-executable instructions, in response to execution, further cause the processor to receive a sequentially composed ordering rule; and a second group of computer-executable instructions that, in response to execution, cause a processor to synthesize a scheduler for executing the irregular algorithm based on the scheduling specification, wherein the second group of computer-executable instructions comprises a fourth group of computer-executable instructions that, in response to execution, cause the processor to implement the at least one ordering rule through definition of one or more workset objects, a workset object of the one or more workset objects having an addition method, a first poll method, and a second poll method, wherein, the addition method comprises a definition for adding an item to the workset object, the first poll method comprises a definition for returning (i) a null value distinct from all items added to the workset object and (ii) a first item being previously added to the workset object in response to invocation of the addition method, and the second poll method comprises a definition for returning (a) the null value only when the workset object is empty and (b) a second item being previously added to the workset object in response to invocation of the addition method, and further wherein concurrent execution of the second poll method and an invocation of a disparate method is avoided, and invocation of the second poll method is avoided when a pending invocation of a method is present, wherein execution of the fourth group of computer-executable instructions yields implementation of the at least one ordering rule, and wherein the fourth group of computer-executable instructions comprises a fifth group of computer-executable instructions that, in response to execution, cause the processor to modify the implementation of the at least one ordering rule by performing one or more of replacing a first rule of the at least one ordering rule with a serial instance of the first rule, tracking a size of a second rule of the at least one ordering rule, or maintaining a size of a third rule of the at least one ordering rule below an upper-bounded size.

* * * * *